(12) United States Patent
Wasserman et al.

(10) Patent No.: US 12,440,666 B2
(45) Date of Patent: Oct. 14, 2025

(54) TRANSDUCER ARRAY HAVING A VARIABLE RESISTANCE CONDUCTIVE GEL LAYER

(71) Applicant: Novocure GmbH, Root (CH)

(72) Inventors: Yoram Wasserman, Haifa (IL); Stas Obuchovsky, Haifa (IL); Nataliya Kuplennik, Haifa (IL); David Shapiro, Haifa (IL)

(73) Assignee: Novocure, GmbH, Root (CH)

( * ) Notice: Subject to any disclaimer, the term of this patent is extended or adjusted under 35 U.S.C. 154(b) by 607 days.

(21) Appl. No.: 17/810,062

(22) Filed: Jun. 30, 2022

(65) Prior Publication Data
US 2023/0001182 A1   Jan. 5, 2023

Related U.S. Application Data

(60) Provisional application No. 63/217,018, filed on Jun. 30, 2021.

(51) Int. Cl.
*A61N 1/00* (2006.01)
*A61N 1/04* (2006.01)
*A61N 1/36* (2006.01)

(52) U.S. Cl.
CPC ......... *A61N 1/0496* (2013.01); *A61N 1/0476* (2013.01); *A61N 1/36002* (2017.08)

(58) Field of Classification Search
None
See application file for complete search history.

(56) References Cited

U.S. PATENT DOCUMENTS 5,080,097 A * 1/1992 Eisenberg ............... A61N 1/046
607/2
2021/0370082 A1* 12/2021 Boll ........................ A61B 18/12

* cited by examiner

*Primary Examiner* — Niketa Patel
*Assistant Examiner* — Anant A Gupta
(74) *Attorney, Agent, or Firm* — DUNLAP CODDING, P.C.

(57) ABSTRACT

A transducer array including a conductive layer and a conductive gel layer is described. The conductive layer has one or more electrode element. The one or more electrode element is configured to receive electrical signals from an electric field generator producing an electric signal as a Tumor Treating Field. The conductive gel layer overlaps the one or more electrode element of the conductive layer. The conductive gel layer has a first region and a second region. The first region has a first resistivity and the second region having a second resistivity with the first resistivity being different from the second resistivity.

20 Claims, 21 Drawing Sheets

TRANSDUCER ARRAY HAVING A VARIABLE RESISTANCE CONDUCTIVE GEL LAYER

CROSS REFERENCE TO RELATED APPLICATIONS AND INCORPORATION BY REFERENCE STATEMENT

The present patent application is a nonprovisional patent application claiming priority to the provisional application U.S. Ser. No. 63/217,018 filed on Jun. 30, 2021. The entire content of the above-referenced application is hereby incorporated herein by reference in its entirety.

STATEMENT REGARDING FEDERALLY SPONSORED RESEARCH OR DEVELOPMENT

Not Applicable.

BACKGROUND

Tumor Treating Fields are low-intensity (e.g., 1-3 V/cm) alternating electric fields within the intermediate frequency range (100-500 kHz) targeting solid tumors by disrupting mitosis. This non-invasive treatment targets solid tumors and is described, for example, in U.S. Pat. Nos. 7,016,725; 7,089,054; 7,333,852; 7,565,205; 8,244,345; 8,715,203; 8,764,675; 10,188,851; and 10,441,776, each of which is hereby incorporated by reference in their entirety.

Tumor Treating Fields are typically delivered through two pairs of transducer arrays that generate perpendicular fields within the treated tumor. The transducer arrays that make up each of these pairs are positioned on opposite sides of the body part that is being treated. For example, in using the OPTUNE® system (manufactured by Novocure Limited, having a principal place of business in St. Helier, Jersey), at least one pair of electrodes of the transducer array is located to the left and right (LR) of the tumor, and at least one pair of electrodes is located anterior and posterior (AP) to the tumor.

Each transducer array used for the delivery of Tumor Treating Fields in the OPTUNE® system comprises at least one set of non-conductive ceramic disk electrodes coupled to the patient's skin. For example, the OPTUNE® system may position the transducer arrays on a patient's shaved head (e.g., treatment of Glioblastoma, hereinafter 'GBM') with the non-conductive ceramic disk electrodes coupled to the patient's skin through a layer of conductive medical gel.

To form the ceramic disk electrodes, a conductive layer is formed on a top surface of nonconductive ceramic material. A bottom surface of the nonconductive ceramic material is coupled to the conductive medical gel. The nonconductive ceramic material is a safety feature to ensure that direct-current signals are blocked from unintentionally being transmitted to the patient. The medical gel may deform to match the body's contours and provide electrical contact between the arrays and the skin; as such, the medical gel interface bridges the skin and reduces interference. The device is intended to be continuously worn by the patient for two to four days before removal for hygienic care and re-shaving (if necessary), followed by reapplication with a new set of arrays. As such, the medical gel remains in substantially continuous contact with an area of the patient's skin for a period of 2-4 days at a time. It is to such assemblies and methods of producing and using the same, that the present disclosure is directed.

DETAILED DESCRIPTION

Figure 1:
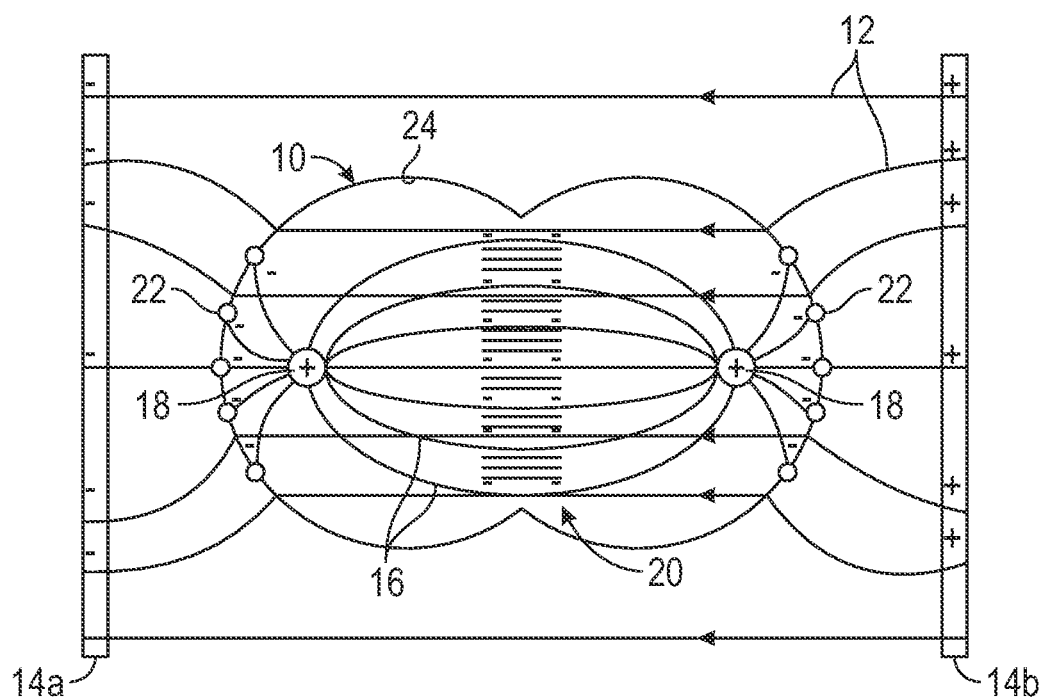
FIG. 1 is an exemplary embodiment of a schematic diagram of electrodes applied to living tissue.

When TTFields are applied to a subject's body, the temperature at the subject's body may increase proportionally to the induced electric field. Regulations limit the amount of current that can be driven through an electrode assembly to an amount that keeps the measured temperature at locations on the subject's body below a temperature threshold. As practiced in the art, the temperature at the location of the electrode assemblies on the subject's body is controlled to be below the temperature threshold by reducing the operational current driven by the electrode assemblies and reducing the strength of the resulting TTFields. This in turn becomes an over-riding limitation on the TTFields strength that can be used to treat the tumor.

On electrode assemblies that comprise multiple electrode elements, the portions of the electrode assemblies positioned directly beneath the electrode elements get hotter than the portions of the electrode assemblies positioned between the electrode elements. Furthermore, on electrode assemblies that comprise multiple electrode elements, higher currents flow through the electrode elements located along the edge of the array compared to the electrode elements located toward the middle of the array. Further still, an electrode element located at a corner or similar sharp bend in the edge of the array will have a higher current than other electrode elements along the edge and near the center of the array. The tendency of an electrode assembly to drive higher currents through electrode elements located along the periphery of the array can lead to higher temperature zones (or "hot spots") e.g., at the corners or edges of the electrode assembly. These hot spots are the locations that reach the threshold temperature first and therefore control the requirement to reduce the current. As such, the generation of hot spots limits the maximum operational current that may be driven by an electrode assembly, and the strength of the resulting TTFields.

This application describes a variety of approaches for reducing or minimizing the uneven distribution of current in electrode assemblies, which ultimately permits the use of higher operating currents without exceeding the threshold temperature. Electrode assemblies operated with increased current can induce stronger TTFields in the subject's body, ultimately leading to better patient outcomes. The electrode assemblies disclosed herein allow current and heat to be spread more evenly over the array thereby minimizing or eliminating hot spots.

One approach for reducing or minimizing hotspots on electrode arrays relies on the incorporation into the array of variable resistivity conductive gel elements to passively balance the electrical current between the various electrode elements and thereby carry heat away from the hot spots, as described below. This lowers the temperature of the hot spots and raises the temperature of the cooler regions when a given AC voltage is applied to the electrode assembly (as compared to the prior art configuration described above). Accordingly, the current can be increased (thereby increasing the therapeutic effect) without exceeding the safety temperature threshold at any point on the subject's skin.

Before explaining at least one embodiment of the inventive concept(s) in detail by way of exemplary language and results, it is to be understood that the inventive concept(s) is not limited in its application to the details of construction and the arrangement of the components set forth in the following description. The inventive concept(s) is capable of other embodiments or of being practiced or carried out in various ways. As such, the language used herein is intended to be given the broadest possible scope and meaning; and the embodiments are meant to be exemplary—not exhaustive. Also, it is to be understood that the phraseology and terminology employed herein is for the purpose of description and should not be regarded as limiting.

Unless otherwise required by context, singular terms shall include pluralities and plural terms shall include the singular.

All patents, published patent applications, and non-patent publications mentioned in the specification are indicative of the level of skill of those skilled in the art to which this presently disclosed inventive concept(s) pertains. All patents, published patent applications, and non-patent publications referenced in any portion of this application are herein expressly incorporated by reference in their entirety to the same extent as if each individual patent or publication was specifically and individually indicated to be incorporated by reference.

As utilized in accordance with the present disclosure, the following terms, unless otherwise indicated, shall be understood to have the following meanings:

The use of the term "a" or "an" when used in conjunction with the term "comprising" in the claims and/or the specification may mean "one," but it is also consistent with the meaning of "one or more," "at least one," and "one or more than one." The term "plurality" refers to "two or more."

The use of the term "at least one of X, Y, and Z" will be understood to include X alone, Y alone, and Z alone, as well as any combination of X, Y, and Z. The use of ordinal number terminology (i.e., "first," "second," "third," "fourth," etc.) is solely for the purpose of differentiating between two or more items and is not meant to imply any sequence or order or importance to one item over another or any order of addition, for example.

The use of the term "or" in the claims is used to mean an inclusive "and/or" unless explicitly indicated to refer to alternatives only or unless the alternatives are mutually exclusive.

Turning now to the inventive concept(s), certain non-limiting embodiments thereof include a conductive pad. The conductive pad has a topcoat layer, an electrode element and a conductive gel element. The electrode element is connected to the topcoat layer, and configured to receive an electrical signal from a generator producing an electric signal as a Tumor Treating Field. In some embodiments, the conductive gel element is directly connected to the electrode element so as to receive an electrical current from the electrode element. In some embodiments, a nonconductive dielectric layer is interposed between the electrode element and the conductive medical gel. The conductive gel element is configured to be in contact with a patient's skin. In some embodiments, the electrode element and the conductive gel element can be constructed of a plurality of flexible films bonded together so as to provide the conductive pad with sufficient flexibility to conform to a patient's body.

Referring now to the drawings and particularly FIG. 1, shown therein is an exemplary embodiment of a dividing cell 10 under the influence of external Tumor Treating Fields 12. In some embodiments, external Tumor Treating Fields 12 may include alternating Tumor Treating Fields 12 in the frequency range of about 50 kHz to about 1 MHz, more commonly about 100 kHz to about 300 kHz. Tumor Treating Fields 12 may be generated by a first electrode 14a having a negative charge and a second electrode 14b having a positive charge. Microtubules 16, as well as other polar macromolecules within the dividing cell 10 or surrounding the dividing cell 10, may have a strong dipole moment providing susceptibility to such Tumor Treating Fields 12. Positive charges of the microtubules 16 may be positioned at centrioles 18. At least one negative pole may be positioned at a center 20 of the dividing cell 10 and at least one negative pole may be positioned at a point of attachment 22 of the microtubules 16 to a cell membrane 24 of the dividing cell 10. The locations of the positive charges and the negative charges form at least one set of double dipoles. The at least one set of double dipoles may provide susceptibility to Tumor Treating Fields 12 of differing directions. As used herein, the alternating electric field may be referred to as the electric field or the Tumor Treating Field 12.

Figure 2:
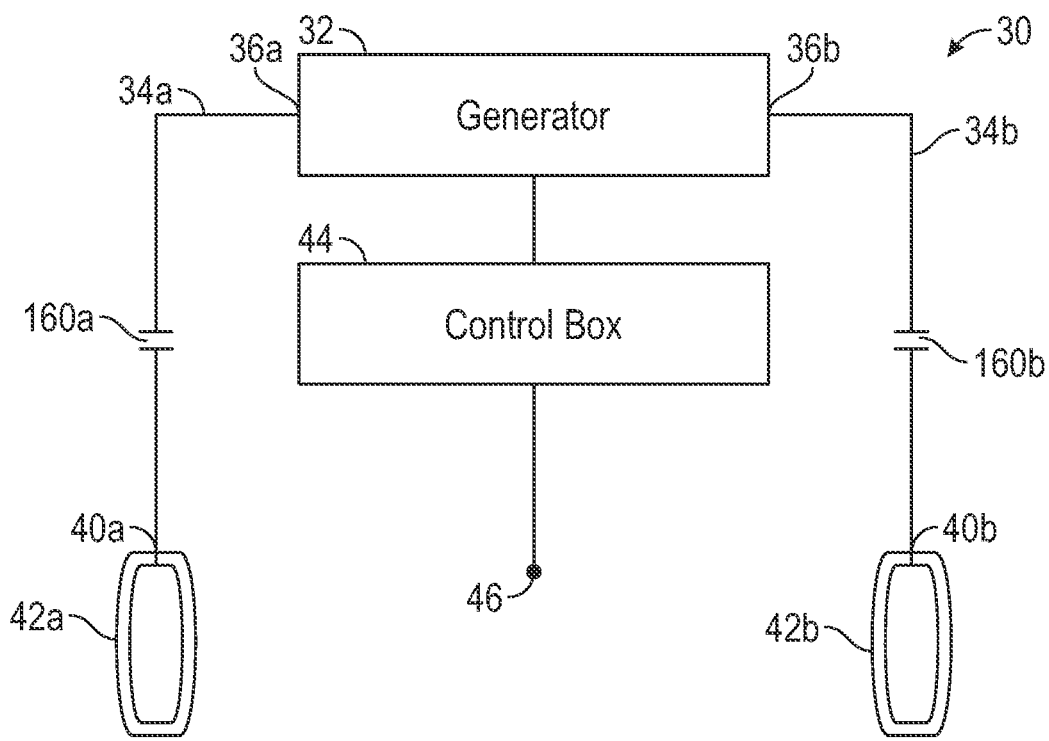
FIG. 2 is an exemplary embodiment of an electronic device configured to generate a Tumor Treating Field.

FIG. 2 illustrates a schematic diagram of an exemplary electronic apparatus 30 configured to generate Tumor Treating Fields 12 in accordance with the present disclosure. The Tumor Treating Fields 12 described may be capable of destroying one or more tumor cells. The specifications of the electronic apparatus 30 as a whole and/or individual components of the electronic apparatus 30 as described herein may be influenced by living systems behaving according to "Ohmic" properties, rather than dielectric properties, at the frequency of the Tumor Treating Fields (e.g., 50 kHz-500 kHz).

Generally, the electronic apparatus 30 may include a generator 32 and two or more conductive leads 34. For example, in FIG. 2, the electronic apparatus includes a first conductive lead 34a and a second conductive lead 34b. The first conductive lead 34a includes a first end 36a and a second end 40a. The first end 36a of the first conductive lead 34a is conductively attached to the generator 32 and the second end 40a of the first conductive lead 34a is connected to a first pad 42a. Similarly, the second conductive lead 34b includes a first end 36b and a second end 40b. The first end 36b of the second conductive lead 34b is conductively attached to the generator 32 and the second end 40b of the second conductive lead 34b is connected to a second pad 42b. The first pad 42a and the second pad 42b may also be referred to as electrodes, such as the first electrode 14a or the second electrode 14b, or electrode pad.

The generator 32 is configured to provide one or more electric signals (TT signals) in the shape of waveforms and/or trains of pulses as an output. Each pad 42a and 42b is activated by the electric signals (e.g., wave forms). As each of the first pad 42a and the second pad 42b is activated by the electric signals, an electrical current is configured to flow between the first pad 42a and the second pad 42b. The electrical current generates an electric field (i.e., Tumor Treating Field), having a frequency and an amplitude, to be generated between the first pad 42a and the second pad 42b.

The generator 32 may be configured to generate an alternating voltage wave form at frequencies in the range from about 50 kHz to about 500 kHz. In some embodiments, the generator 32 is configured to generate an alternating voltage wave form at frequencies in the range of about 50 kHz to about 1 MHz, for example, about 100 kHz to about 300 kHz (i.e., the Tumor Treating Fields). The voltages are such that an electric field intensity in tissue within the treatment area is in the range of about 0.1 V/cm to about 10 V/cm. To achieve this field, the potential difference between the two conductors 14 (i.e., electrode element 82 described in detail below and shown in FIG. 4) in each of the first pad 42a or second pad 42b may be determined by the relative impedances of the components of the system, i.e., a fraction of the electric field on each component is given by that component's impedance divided by a total circuit impedance.

In some embodiments, the first pad 42a and the second pad 42b may be configured to generate an alternating electrical current and field within a target region of a patient. The target region may comprise, for example, at least a portion of a tumor. Generation of the alternating electrical current and/or field may be configured to selectively destroy and/or inhibit growth of at least a portion of the tumor. The alternating electrical current and field may be generated at any frequency capable of selectively destroying and/or inhibiting growth of at least a portion of the tumor. For example (but not by way of limitation), the alternating electrical current and field may have a frequency of about 50 kHz, about 75 kHz, about 100 kHz, about 125 kHz, about 150 kHz, about 175 kHz, about 200 kHz, about 225 kHz, about 250 kHz, about 275 kHz, about 300 kHz, about 325 kHz, about 350 kHz, about 375 kHz, about 400 kHz, about 425 kHz, about 450 kHz, about 475 kHz, about 500 kHz, or about 1 MHz, as well as a range formed from any of the above values (i.e., a range of from about 50 kHz to about 500 kHz, a range of from about 100 kHz to about 150 kHz, a range of from about 150 kHz to about 300 kHz, etc.), and a range that combines two integers that fall between two of the above-referenced values (i.e., a range of from about 32 kHz to about 333 kHz, a range of from about 78 kHz to about 298 kHz, etc.).

In some embodiments, the alternating electric current and field may be configured to be imposed at two or more different frequencies. In some embodiments, each of the two or more different frequencies may be selected from any of the above-referenced values, or a range formed from any of the above-referenced values, or a range that combines two integers that fall between two of the above-referenced values.

In some embodiments, the first pad 42a and the second pad 42b (i.e., a pair of pads) may be configured differently depending upon the application in which the pair of pads 42a and 42b are to be used. In some embodiments, the pair of pads 42a and 42b may be externally applied to a patient (e.g., applied to an epidermis layer of skin of a patient) with the electric current and generation of the electric field (Tumor Treating Field) provided within tissue of the patient. Generally, each of the first pad 42a and the second pad 42b is placed on the epidermis of the skin of the patient by a user such that the electric field is configured to generate across tissue of a patient within a predetermined treatment area. Tumor Treating Fields that are applied externally can be of a local type or widely distributed type, for example, the treatment of skin tumors and treatment of lesions close to the skin surface.

In some embodiments, the user may be a medical professional, such as a doctor, nurse, therapist, or other person acting under the instruction of a doctor, nurse, or therapist. In some embodiments, the user may be the patient, that is, the patient (and/or a helper) may place the pads 42a and 42b on the epidermis layer within a predetermined treatment area.

In some embodiments, the electronic apparatus 30 may optionally include a control box 44 and one or more temperature sensor 46 coupled to the control box 44. In some embodiments, multiple temperature sensors 46 may be positioned to sense temperature at the predetermined treatment area. The one or more temperature sensor 46 may include, but are not limited to, thermistors, thermocouples, resistance temperature detectors (RTDs), integrated circuit temperature sensors such as the Analog Devices AD590 and the Texas Instruments LM135, and/or combinations thereof. It is contemplated that any temperature sensor 46 known within the art may be used if configured to provide an accurate and/or precise temperature reading of the predetermined treatment area. The control box 44 may be configured to control amplitude of the electric field so as not to generate excessive heating in the treatment area.

In some embodiments, the control box 44 may be configured to control output of the generator 32. For example, in some embodiments, the control box 44 may be configured to control output of the generator 32 such that output remains constant at a value preset by a user. In some embodiments, the control box 44 may be configured to set output of the generator 32 at a maximal value, with the maximal value configured such that excessive heat is not provided at the predetermined treatment area. In some embodiments, the control box 44 may be configured to provide one or more feedback indicators. For example, the control box 44 may be configured to provide a feedback indicator (e.g., sound, light) when a temperature of the predetermined treatment area (as sensed by temperature sensor 46) exceeds a preset limit (such as, for example, 41° C.).

In some embodiments, the control box 44 may be configured to control output of the generator 32 based on one or more readings of the temperature sensor 46. In some embodiments, one or more temperature sensor 46 may be connected to and/or otherwise associated with the first pad 42a or the second pad 42b and configured to sense temperature of the epidermis and/or treatment area at either one or both of the first pad 42a or the second pad 42b.

In some embodiments, one or more of the conductive leads 34 may be standard isolated conductors having a flexible metal shield. In some embodiments, the flexible metal shield may be grounded to prevent spread of any electric field generated by the one or more conductive leads 34.

Pads 42a and 42b may be shaped, sized, and positioned to generate the Tumor Treating Field configuration, direction, and intensity at the treatment area. To that end, the pads 42a and 42b may be square, rectangular, circular, oval, or any fanciful shape.

Figure 3A:
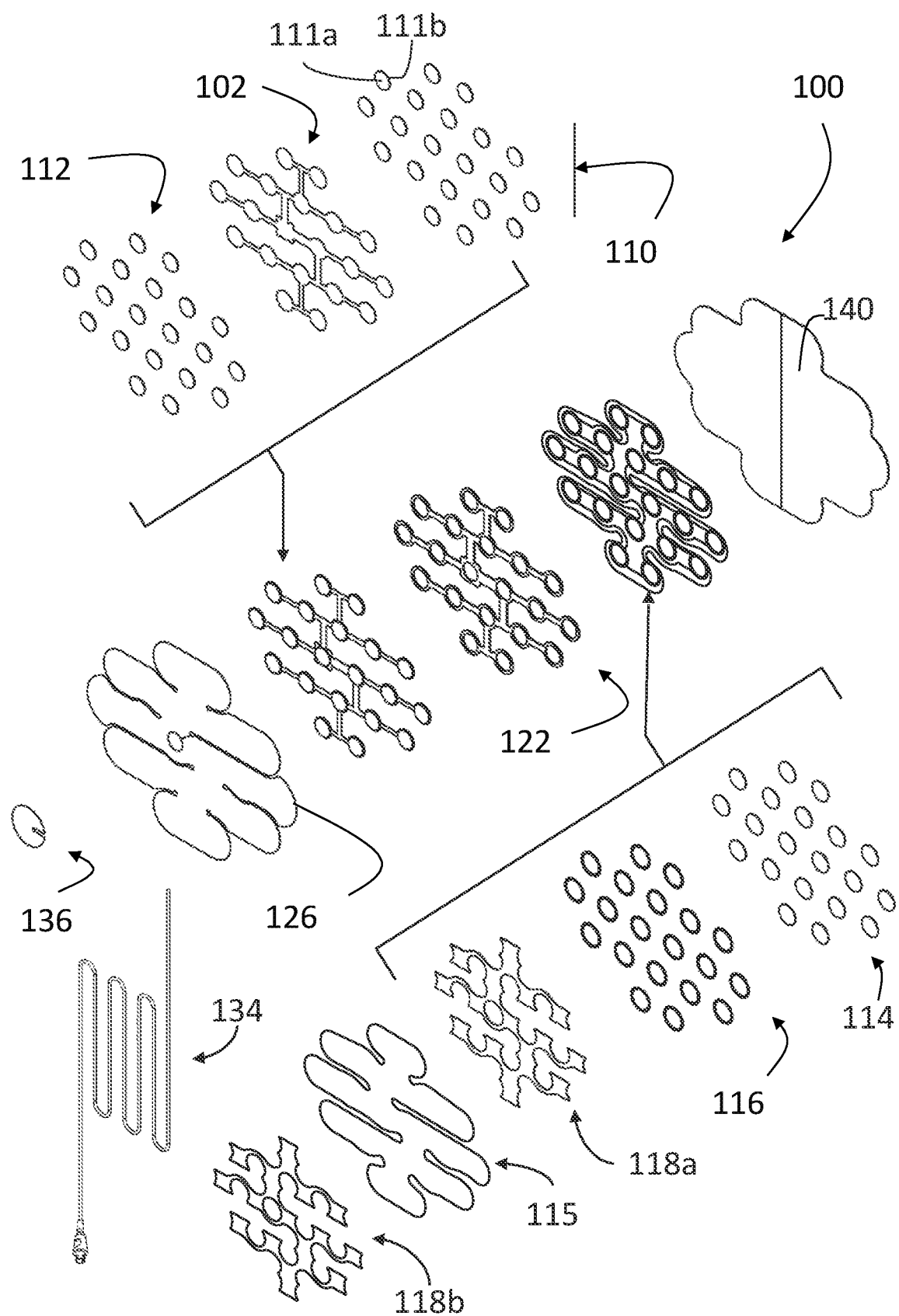
FIG. 3A is an exploded view of one embodiment of a transducer array that has a first layout of electrode elements.
Figure 3B:
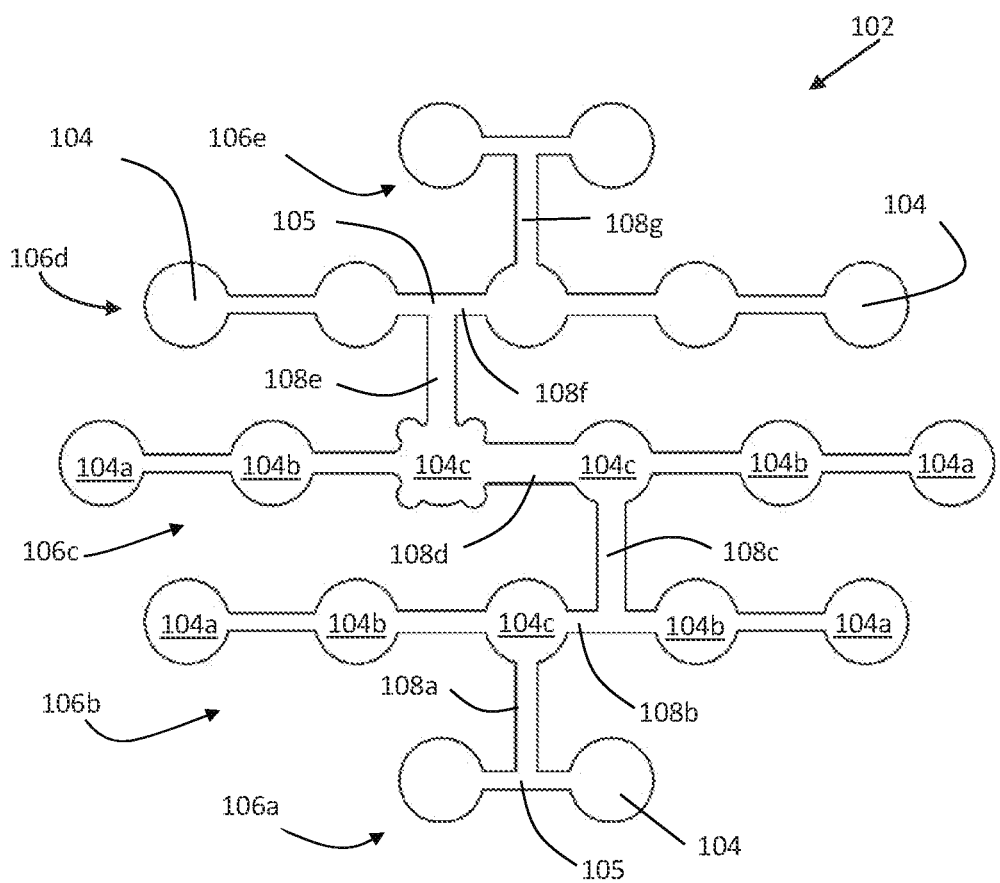
FIG. 3B is a plan view of a flex circuit used in the transducer array illustrated in FIG. 3A.
Figure 3C:
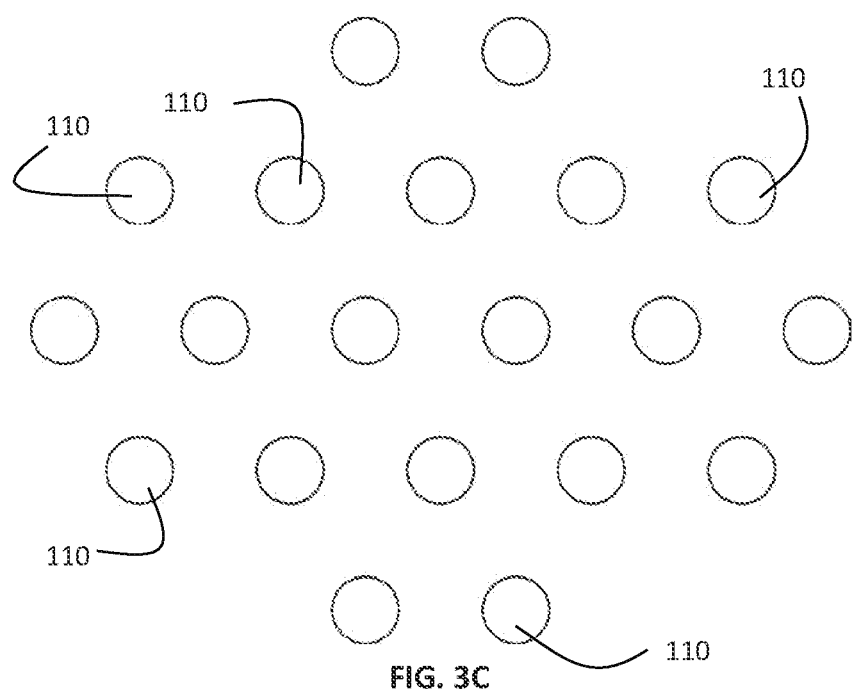
FIG. 3C is a plan view of electrode elements used in the transducer array illustrated in FIG. 3A.
Figure 3D:
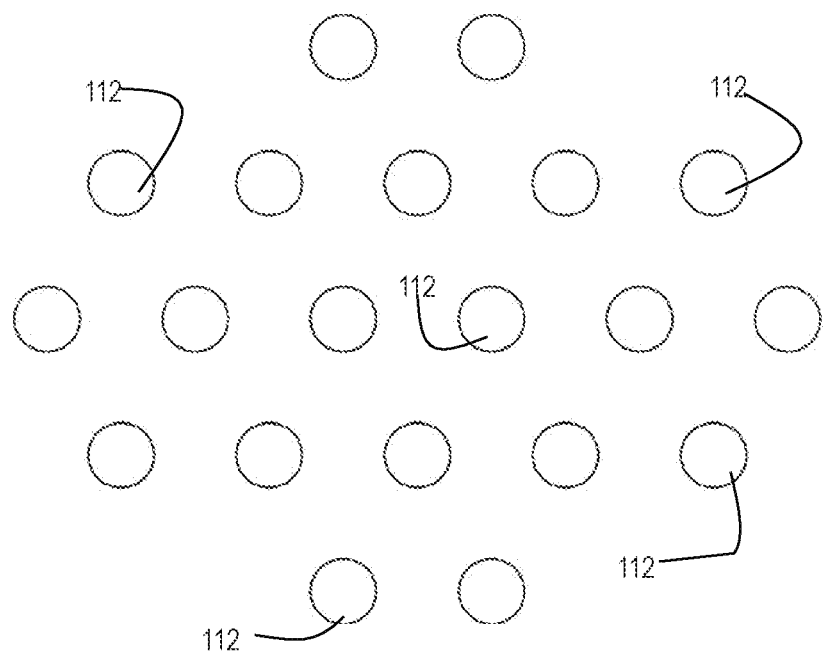
FIG. 3D is a plan view of stiffeners used in the transducer array illustrated in FIG. 3A.
Figure 3E:
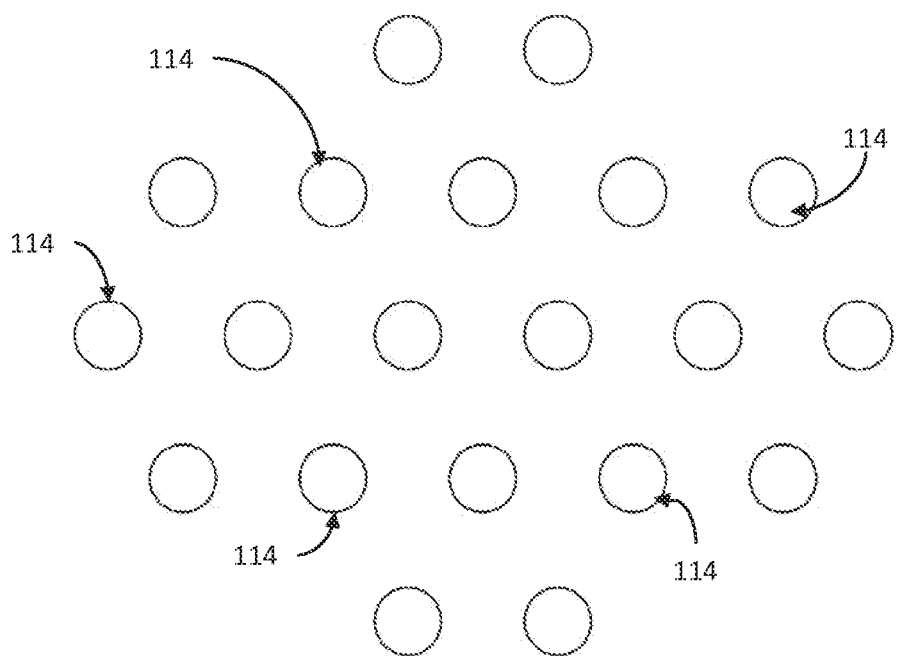
FIG. 3E is a plan view of conductive hydrogel discs used in the transducer array illustrated in FIG. 3A.
Figure 3F:
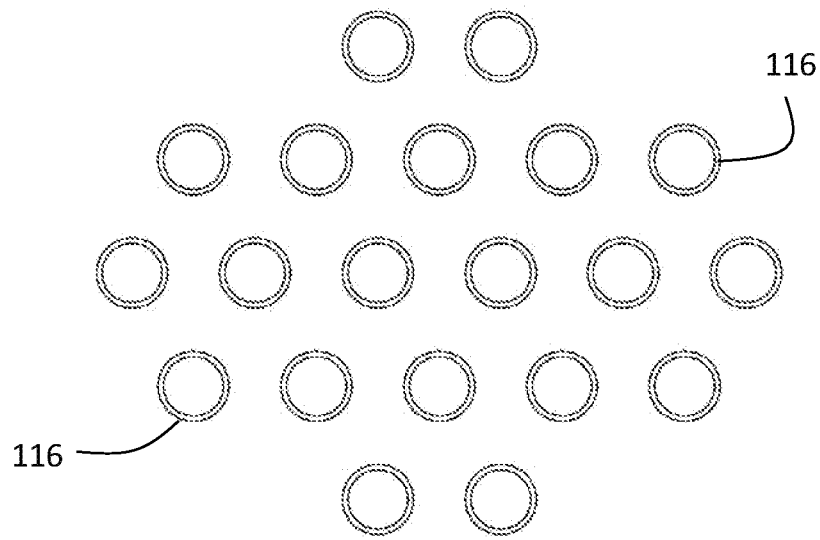
FIG. 3F is a plan view of hydrogel barriers used in the transducer array illustrated in FIG. 3A.
Figure 3G:
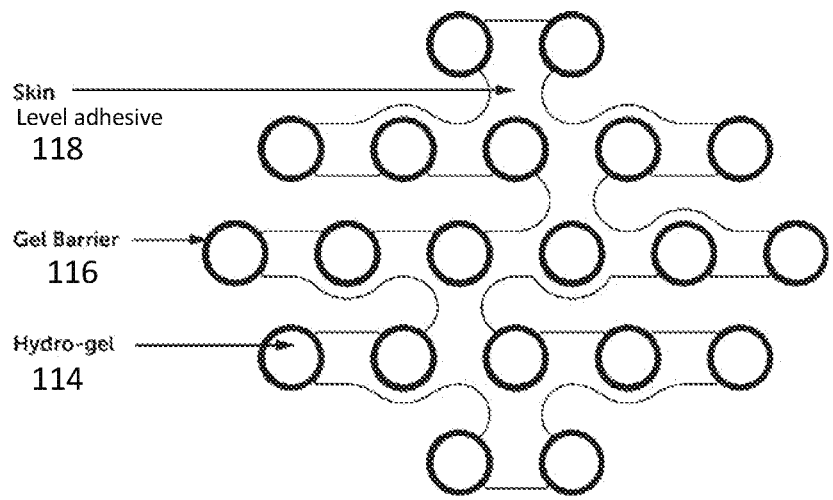
FIG. 3G is a view of the hydrogel discs and the hydrogel barriers as "seen" by the patient's skin.
Figure 3H:
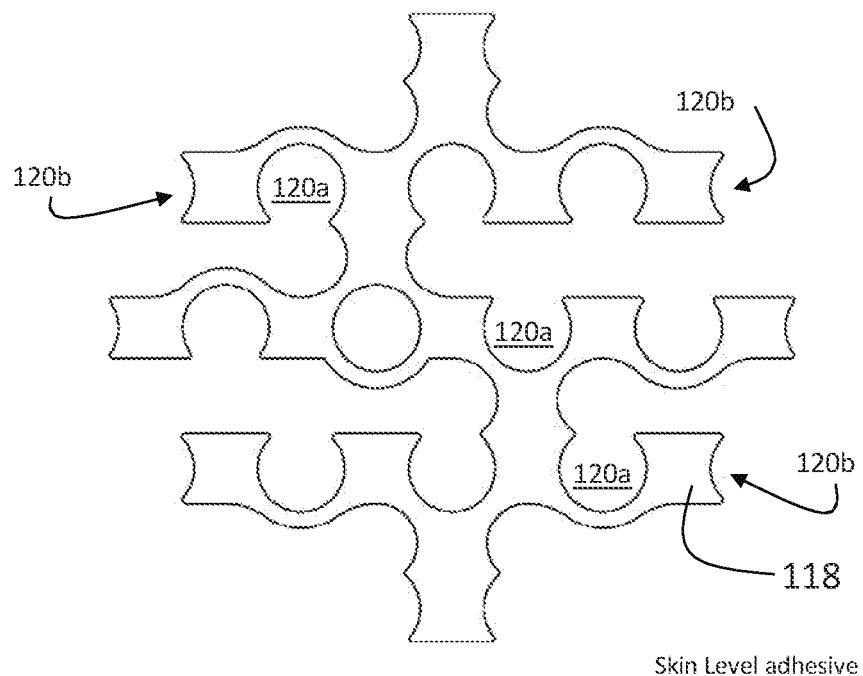
FIG. 3H is a plan view of a skin-level adhesive layer used in the transducer array illustrated in FIG. 3A.
Figure 3I:
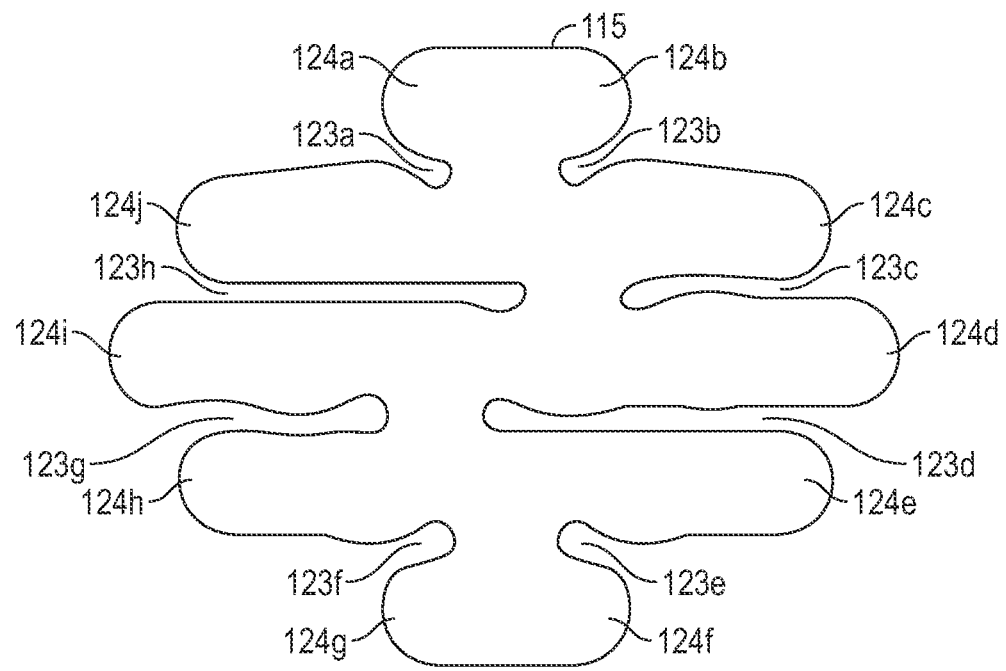
FIG. 3I is a plan view of a support layer used in the transducer array illustrated in FIG. 3A.
Figure 3J:
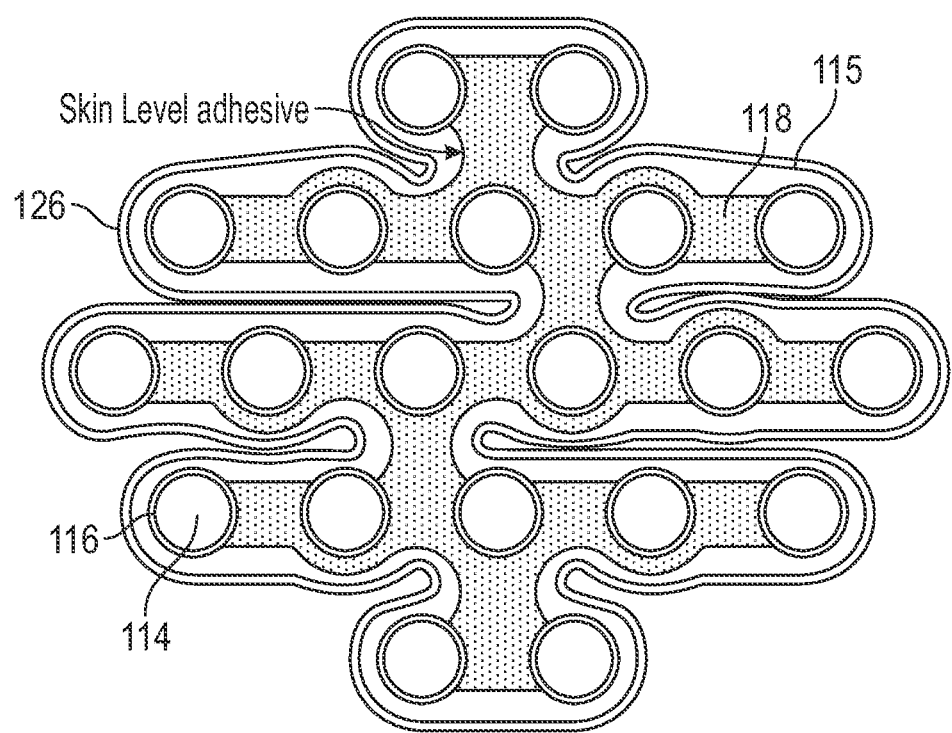
FIG. 3J is a plan view of the support layer of FIG. 3J connected to the top layer as "seen" by the patient's skin.
Figure 3K:
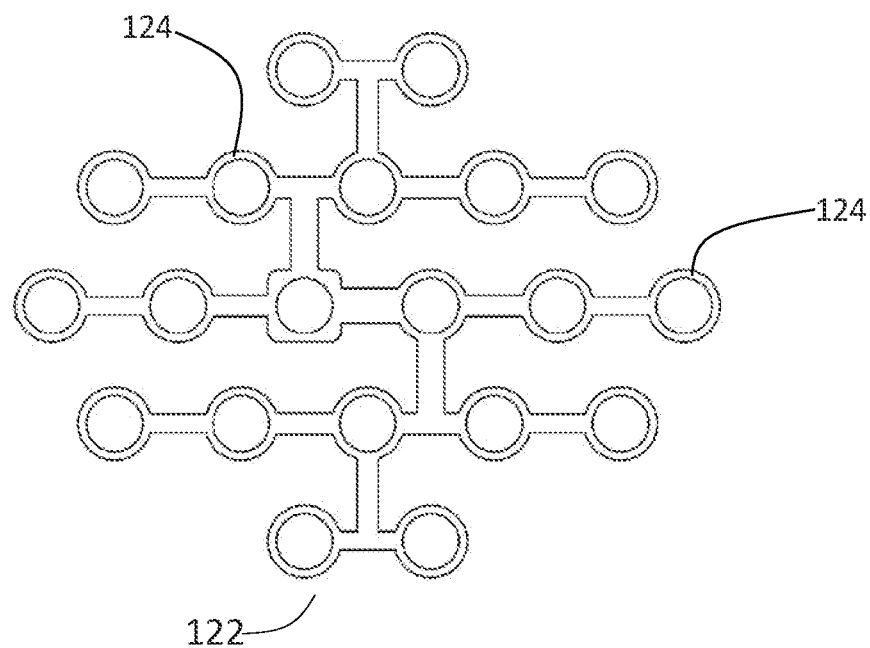
FIG. 3K is a plan view of a foam layer used in the transducer array illustrated in FIG. 3A.
Figure 3L:
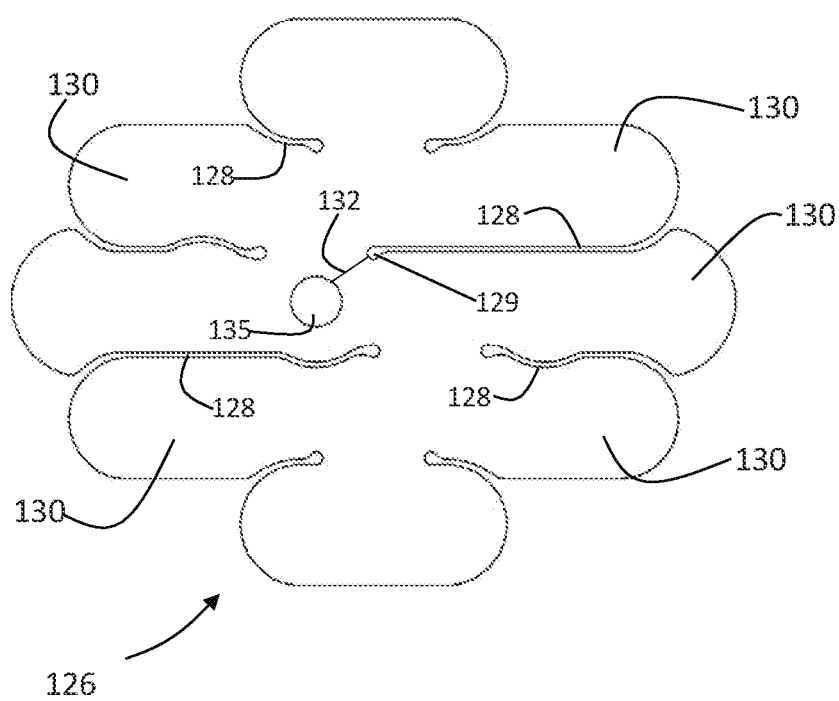
FIG. 3L is a plan view of a top, covering adhesive-backed layer used in the transducer array illustrated in FIG. 3A.
Figure 3M:
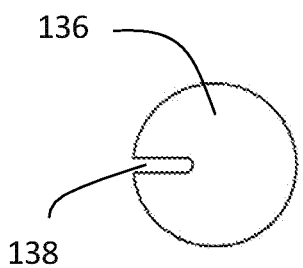
FIG. 3M is a plan view of a slot cover used in the transducer array illustrated in FIG. 3A.
Figure 3N:
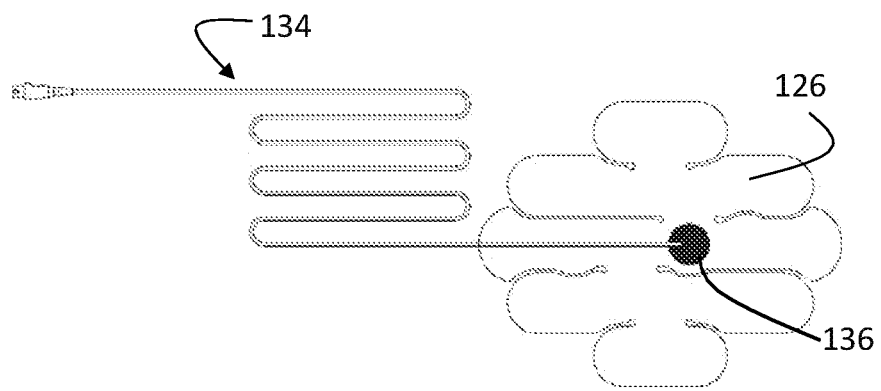
FIG. 3N is a plan view illustrating an appearance of a transducer array as illustrated in FIG. 3A as applied to a patient.
Figure 3O:
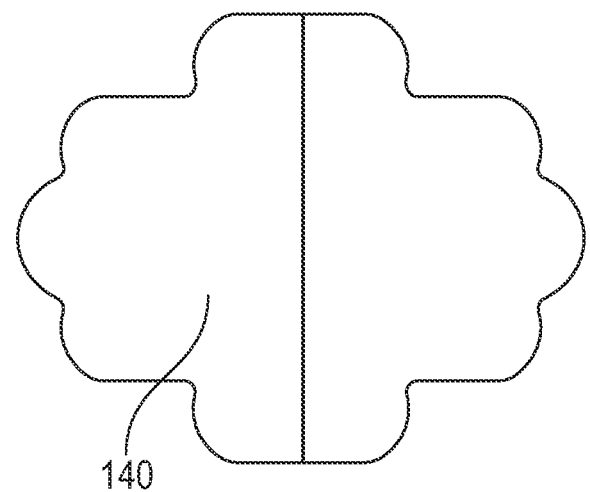
FIG. 3O is a plan view of a release liner used in the transducer array illustrated in FIG. 3A.
Figure 3P:
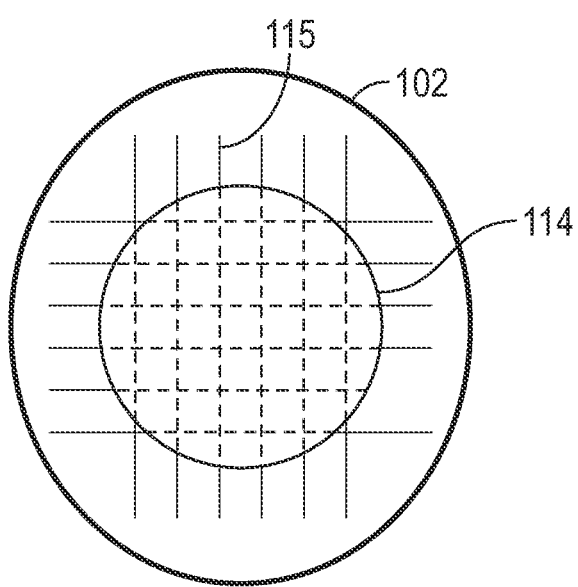
FIG. 3P is a plan view of a support layer adhered to the flex circuit with a hydrogel material.

FIGS. 3A-3P depict a first embodiment of a transducer array 100 incorporating the pads 42a and 42b. The pads 42a and 42b are referred to below as "electrode elements." The transducer array 100 is also referred to herein as an "electrode apparatus" with a first layout of electrode elements, with FIG. 3A being an exploded or assembly view showing all of the various components and their arrangement relative to each other. FIGS. 3B-3P show the individual components in greater detail.

One of the components that defines the configuration of the transducer array 100 is the flex circuit 102 (FIGS. 3A and 3B), which may be made with electrical traces extending along the branches of the flex circuit 102 as is well known in the art. The flex circuit 102 has a branching or ramified configuration. There is a central trunk 108a-108g that extends in a longitudinal direction (FIG. 3B). There is also a plurality of branches that extend laterally from both sides of the trunk 108a-g of the flex circuit 102. In some embodiments (including the embodiments depicted in FIGS. 3A, 3B, and 3K), these branches are perpendicular to the longitudinal direction and are arranged as rows 106a-106e of the flex circuit 102. In the illustrated embodiment, each of the rows 106a-106e of the flex circuit 102 includes two branches—one on either side of the trunks 108a-108g. The proximal end of each branch is connected to and extends from the trunk 108a-g of the flex circuit 102, while the distal end of each branch remains free. Advantageously, this configuration improves the flexibility of the flex circuit 102, and reduces tensile stresses applied on the transducer array 100 by skin movement (bending, stretching, twisting, breathing, etc.), thereby improving and prolonging adhesion of the transducer array 100 to the skin. The flexible nature of the transducer array 100 also improves user comfort and reduces skin damage. Note that in the embodiment illustrated in FIGS. 3A and 3B, the trunk 108a-108g shifts back and forth in segments between successive rows of the flex circuit 102. In these embodiments, only some of the segments 108a, 108c, 108e, and 108g extend in the longitudinal direction, and those longitudinal segments are interconnected by additional segments 108b, 108d, and 108f that extend in the lateral direction. As a result, in these embodiments, the segments 108b, 108d, and 108f shift back and forth in the lateral direction as the segments 108a, 108c, 108e and 108g extend in the longitudinal direction. In alternative embodiments, the trunk is straight.

The flex circuit 102 includes a number of mounting pads 104 arranged along the rows 106a-106e.

A number of electrode elements 110 (FIGS. 3A and 3C)—for example, twenty as shown in the FIG. 3A embodiment for a typically sized adult male—are disposed on the inner (i.e., skin-facing) side of the mounting pads 104 of the flex circuit 102 (shown in FIGS. 3A and 3B) with an electrically conductive connection between each of the electrode elements 110 and the flex circuit 102. The electrode elements 110 may be on the order of 1 mm thick and 2 cm in diameter and may optionally be slightly smaller in diameter than the mounting pads 104. Each of the electrode elements 110 may be formed from a circular conductive plate that is coated with a ceramic dielectric material as is known in the art or a high dielectric constant polymer film (for example, having a dielectric constant greater than 10 or greater than 30), and the circular conductor is electrically connected to an electrical contact of the flex circuit 102. The dielectric material (ceramic or polymer) faces toward the patient's body so that the ceramic dielectric material can make contact with the patient's skin (preferably via an intervening layer of hydrogel, as described below). The dielectric material may be a ceramic material, a non-flexible polymer, or a flexible polymer film.

The electrode elements 110 are provided with an outer side 111a and an inner side 111b (FIG. 3A). Only one of the electrode elements 110 is labeled with the reference numerals 111a and 111b for purposes of brevity. A corresponding number of stiffeners 112 (FIGS. 3A and 3D) may optionally be attached to the outer side 111a of the mounting pads 104 of the flex circuit 102 generally opposite the electrode elements 110 attached to the inner side 111b. The stiffeners 112 may be on the order of 1 mm thick and may be slightly smaller in diameter than the mounting pads 104. The stiffeners 112 may be made from any suitable material (e.g., a stiff, nonconductive plastic). In general, the stiffeners 112 help prevent the electrode elements 110 from breaking, given the flexible nature of the flex circuit 102 and the thin, fragile nature of the ceramic dielectric used for the electrode elements 110.

In some embodiments, each of the electrode elements 110 has a corresponding disc of conductive gel element 114 (FIGS. 3A, 3P, and 4) disposed on the inner side 111b of the electrode element 110, to establish good electrical conductivity with the patient's skin. In some embodiments, the conductive gel element 114 is slightly larger in diameter than the electrode element 110. The material is preferably gamma sterilization-compatible. For example, the conductive gel element 114 may be a hydrogel made from AG625, which is available from Axelgaard (Fallbrook, CA, USA), with a thickness on the order of 635 micrometers, and with a volume resistivity of 1000 ohm-cm max. In some embodiments, the conductive gel element 114 includes one or more conductive gel layer 109 (see FIG. 4) having a bulk electron transport agent providing a source of free ions therein to enable electrical conductivity. In some embodiments, at least a portion of the one or more conductive gel layer may be formed of a conductive gel or a semi-solid conductive gel. When present, the source of free ions in the gel may be any salt or other substance that serves as a source of free ions that are capable of floating substantially freely within the gel. The free ions may serve to conduct electricity and/or reduce impedance. In some embodiments, conductive gel element 114 includes two conductive gel layers 109a and 109b. The conductive gel layers 109a and 109b may include a polymeric hydrogel. In some embodiments, the conductive gel layers 109a and 109b may include adhesive properties. In some embodiments, the conductive gel layer 109a may be constructed of a same or different material as the conductive gel layer 109b.

Figure 4:
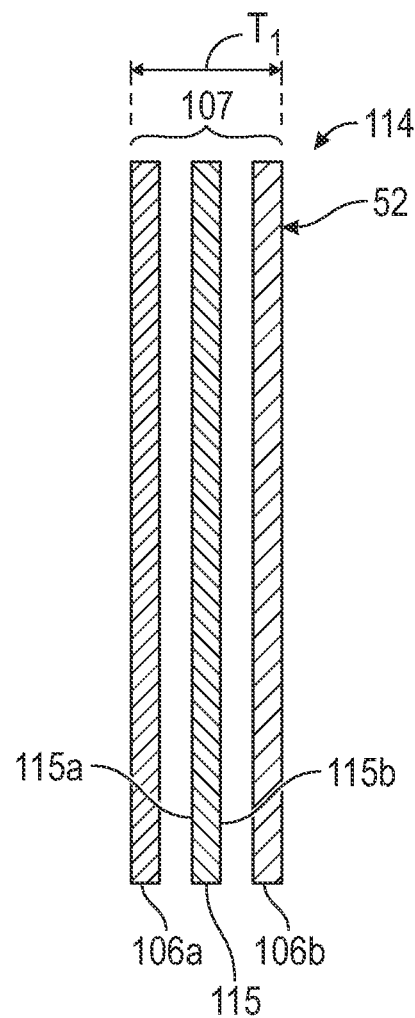
FIG. 4 is an exploded side view of a conductive gel assembly having conductive gel layers on both sides of a support layer in accordance with the present disclosure.

In some embodiments, the electrode array includes a conductive gel assembly 107 (FIG. 4), including one or more conductive gel element 114 and a support layer 115 connected to the one or more conductive gel element 114. The conductive gel element 114 includes one or more conductive gel layers 109 that may be prefabricated prior to inclusion on the electrode elements 110. In some embodiments, one or more conductive gel layers 109 may be applied in liquid form onto the electrode elements 110 and then cured (e.g., UV curing, electron beam curing) directly on the electrode element 110 and/or other portion of the transducer array 100. The support layer 115 can be applied to cover the conductive gel layer 109 and the one or more electrode elements 110, and another amount of conductive gel in liquid form or cured form may be applied to the support layer 115 so that the conductive gel layers 109 forming one of the conductive gel elements 114 are aligned and sandwich the support layer 115 (FIG. 4). In some embodiments, one or more conductive gel layers 109 may be cured directly on the support layer 115, for example, and then subsequently applied to the electrode elements 110. The support layer 115 includes a first side 115a and a second side 115b. The support layer 115 is sized and dimensioned to extend over one or more electrode elements 110. The conductive gel layer 109a is disposed upon and attached to the first side 115a of the support layer 115. The conductive gel layer 109b is disposed upon and attached to the second side 115b of the support layer 115. The conductive gel layer 109 can be disposed on both of the first side 115a and the second side 115b to encapsulate a portion of the support layer 115 between the conductive gel layers 109a and 109b. The conductive gel assembly 107 can be manufactured separately from the other components of the transducer array 100 and subsequently connected to the transducer array 100, or the conductive gel assembly 107 can be manufactured with the transducer array 100, such as by forming the conductive gel layer(s) 109 on the electrode elements 110 either before or after application of the support layer 115 over the electrode elements 110.

The bulk electron transport agent(s) may be any substance that is capable of enhancing the electrical and/or thermal conductivity of the conductive gel. In certain non-limiting embodiments, the bulk electron transport agent(s) includes one or more ionic compounds, one or more metals, or one or more non-metals, as well as any combinations thereof. In certain non-limiting embodiments, the bulk electron transport agent comprises an amorphous carbon and/or a crystalline carbon. Particular (but non-limiting) examples of bulk electron transport agents that may be utilized in accordance with the present disclosure include carbon black, graphene, and graphite.

In some embodiments, the conductive gel element 114 and/or the one or more conductive gel layer 109 are formed primarily of a conductive gel or semi-solid conductive gel such as described below. The conductive gel element 114 may be in any form that allows the electrode elements 110 to function in accordance with the present disclosure. For example (but not by way of limitation), the conductive gel element 114 may be in the form of a hydrogel or a hydrocolloid.

The conductive gel element 114 may have properties including, but not limited to, high conductivity, tackiness, and/or biocompatibility for extended periods of time. For example, the conductive gel element 114 may include AG603 Hydrogel, available from AmGel Technologies, having a principal place of business in Fallbrook, California, USA.

The conductive gel element 114 may be used with modified hydrogels, including but not limited to perforations, recesses, and/or protrusions. Such features are further disclosed in detail in U.S. Provisional Patent Application No. 63/020,636, filed May 6, 2020, entitled "Conductive Gel Compositions Comprising Bulk Electron Transport Agents and Methods of Production and Use Thereof", and U.S. patent application Ser. No. 17/313,114, filed May 6, 2021, entitled "Conductive Pad Generating Tumor Treating Field and Methods of Production and Use Thereof", which are hereby incorporated in their entirety.

In some embodiments, the conductive gel element 114 may be sterile. In some embodiments, the conductive gel element 114 may be configured such that the conductive gel element 114 does not substantially degrade upon exposure to sterilization conditions that include gamma rays or ethylene oxide gas, for example.

The conductive gel element 114 may be formed of any hydrophilic polymer that allows the conductive gel element 114 to function in accordance with the present disclosure. For example (but not by way of limitation), the conductive gel element 114 may be a polyacrylic acid gel, a povidone gel, or a cellulose gel. In addition, the conductive gel may comprise at least one of chitosan, alginate, agarose, methylcellulose, hyaluronan, collagen, laminin, matrigel, fibronectin, vitronectin, poly-1-lysine, proteoglycans, fibrin glue, or gels made by decellularization of engineered and/or natural tissues, as well as any combinations thereof. Further, the conductive gel element 114 may comprise at least one of polyglycolic acid (PGA), polylactic acid (PLA), poly-caprolactone (PCL), polyvinyl alcohol (PVA), polyethylene glycol (PEG), methyl methacrylate, poly(methyl methacrylate) (PMMA), poly(2-hydroxyethyl methacrylate) (PolyHEMA), poly(glycerol sebacate), polyurethanes, or poly(isopropylacrylamide), poly(N-isopropylacrylamide), or any combination thereof.

In some embodiments, the conductive gel element 114 may comprise one or more of the following chemical and structural features/properties: a polymer chain length in a range of from about 1 nm to about 200 nm; a free salt present at a concentration in a range of from about 0.1 mM to about 1 M; a pH in a range of from about 6 to about 8; a volume resistivity of less than about 100 Ohm-in; a skin adhesion rate of at least about 100 g/inch; and a thickness in a range of from about 10 mil to about 50 mil.

In some embodiments, the conductive gel element 114 may be optimized for use at body temperature (i.e., in a range of from about 34° C. to about 41° C.) for extended periods of time.

The polymer(s) of the conductive gel element 114 may be provided with any polymer chain length that allows the conductive gel element 114 composition(s) to function as described herein. For example (but not by way of limitation), the polymer chain length may be about 1 nm, about 2 nm, about 3 nm, about 4 nm, about 5 nm, about 6 nm, about 7 nm, about 8 nm, about 9 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, about 100 nm, about 105 nm, about 110 nm, about 115 nm, about 120 nm, about 125 nm, about 130 nm, about 135 nm, about 140 nm, about 145 nm, about 150 nm, about 155 nm, about 160 nm, about 165 nm, about 170 nm, about 175 nm, about 180 nm, about 185 nm, about 190 nm, about 195 nm, about 200 nm, and above, as well as a range that combines any two of the above-referenced values (i.e., a range of from about 3 nm to about 175 nm, a range of from about 5 nm to about 150 nm, or a range of from about 10 nm to about 125 nm, a range of from about 15 nm to about 100 nm, etc.), and a range that combines two integers that fall between two of the above-referenced values (i.e., a range of from about 3 nm to about 157 nm, etc.).

In some embodiments, the range of the polymer chain length may be dependent upon the frequency(ies) of the alternating electric field. For example (but not by way of limitation), the range of the polymer chain length may be based upon a range of frequencies of the alternating electric field. Non-limiting examples include a range of from about 5 nm to about 50 nm when the alternating electric field has a frequency in a range of from about 50 kHz to about 150 kHz, a range of from about 50 nm to about 100 nm when the alternating electric field has a frequency in a range of from about 150 kHz to about 300 kHz, etc.

In some embodiments, the conductive gel element 114 may include at least one of a decreased polymer chain length and an added free salt when compared to existing gel compositions; the decrease in polymer chain length and increase in free salt concentration further enhances the conductivity of the conductive gel element 114 while reducing the occurrence of skin irritation caused by the conductive gel element 114. In some embodiments, the conductive gel element 114 comprises a free salt present via incorporation within the conductive gel element or as one layer of a multi-layered gel (i.e., a bilayered gel). The term "free salt" refers to salt molecules (ions) that are not incorporated as part of the polymerized chain structure but rather are floating substantially freely within the conductive gel and thus are a source of free ions that conduct electricity and thus reduce impedance.

When free salt is present in the conductive gel element 114, the free salt may be any salt or other substance that serves as a source of free ions that are capable of floating substantially freely within the conductive gel element 114, wherein the free ions serve to conduct electricity and thus reduce impedance. In certain particular (but non-limiting) embodiments, the free salt present in the conductive gel element 114 is a source of chloride ions, citrate ions, silver ions, iodide ions, etc., or any other ions that are known to be good conductors. Non-limiting examples of free salts that may be utilized in accordance with the present disclosure are salts that contain potassium (K), ammonium (NH4+), sodium (Na), nitrate, bicarbonate, and the like. Particular non-limiting examples of free salts that may be utilized in accordance with the present disclosure are NaCl, KCl, CaCl2, MgCl2, ZnCl2, silver iodide (AgI), silver dihydrogen citrate (SDC), sodium dihydrogen citrate, combinations thereof, and the like.

The free salt present in the gel may be provided with any concentration that allows the conductive gel element 114 compositions to function as described herein. For example (but not by way of limitation), the free salt concentration may be at least about 0.1 mM, about 0.5 mM, about 1 mM, about 2 mM, about 3 mM, about 4 mM, about 5 mM, about 6 mM, about 7 mM, about 8 mM, about 9 mM, about 10 mM, about 15 mM, about 20 mM, about 25 mM, about 30 mM, about 35 mM, about 40 mM, about 45 mM, about 50 mM, about 55 mM, about 60 mM, about 65 mM, about 70 mM, about 75 mM, about 80 mM, about 85 mM, about 90 mM, about 95 mM, about 100 mM, about 150 mM, about 200 mM, about 250 mM, about 300 mM, about 350 mM, about 400 mM, about 450 mM, about 500 mM, about 550 mM, about 600 mM, about 650 mM, about 700 mM, about 750 mM, about 800 mM, about 850 mM, about 900 mM, about 950 mM, about 1 M, or higher, as well as any range that combines any two of the above-referenced values (i.e., a range of from about 0.1 mM to about 100 mM, a range of from about 1 mM to about 50 mM, etc.), and a range that combines two integers that fall between two of the above-referenced values (i.e., a range of from about 12 mM to about 550 mM, etc.).

In some embodiments, the free salt concentration is dependent upon the frequency(ies) of the alternating electric field. For example (but not by way of limitation), the range of the free salt concentration may be based upon a range of frequencies of the alternating electric field. Non-limiting examples include a range of from about 0.1 mM to about 50 mM when the alternating electric field has a frequency in a range of from about 50 kHz to about 150 kHz, a range of from about 50 mM to about 100 mM when the alternating electric field has a frequency in a range of from about 150 kHz to about 300 kHz, etc.

The conductive gel element 114 may be provided with any pH that does not damage the skin of a patient or cause chemical irritation of the skin upon prolonged exposure to the conductive gel element 114. For example (but not by way of limitation), the conductive gel element 84 may have a pH of about 6, about 6.5, about 7, about 7.5, about 8, as well as a range formed from any of the above values (i.e., a range of from about 6 to about 8, a range of from about 6.5 to about 7.5, etc.).

The conductive gel element 114 may be provided with any level of volume resistivity that maximizes the conductivity of the gel. For example (but not by way of limitation), the conductive gel element 114 may have a volume resistivity of less than about 100 Ohm-in, less than about 95 Ohm-in, less than about 90 Ohm-in, less than about 85 Ohm-in, less than about 80 Ohm-in, less than about 75 Ohm-in, less than about 70 Ohm-in, less than about 65 Ohm-in, less than about 60 Ohm-in, less than about 55 Ohm-in, less than about 50 Ohm-in, less than about 45 Ohm-in, less than about 40 Ohm-in, less than about 35 Ohm-in, less than about 30 Ohm-in, less than about 25 Ohm-in, less than about 20 Ohm-in, less than about 15 Ohm-in, less than about 10 Ohm-in, or lower, as well as a range formed of any of the above values (i.e., a range of from about 10 Ohm-in to about 100 Ohm-in, etc.) and a range that combines two integers that fall between two of the above-referenced values (i.e., a range of from about 13 Ohm-in to about 96 Ohm-in, etc.).

The conductive gel element 114 may be provided with any skin adhesion rate that allows the conductive gel element 114 to function in accordance with the present disclosure. For example (but not by way of limitation), the skin adhesion rate of the gel may be at least about 100 g/inch, at least about 110 g/inch, at least about 120 g/inch, at least about 130 g/inch, at least about 140 g/inch, at least about 150 g/inch, at least about 160 g/inch, at least about 170 g/inch, at least about 180 g/inch, at least about 190 g/inch, at least about 200 g/inch, at least about 210 g/inch, at least about 220 g/inch, at least about 230 g/inch, at least about 240 g/inch, at least about 250 g/inch, at least about 260 g/inch, at least about 270 g/inch, at least about 280 g/inch, at least about 290 g/inch, at least about 300 g/inch, or higher, as well as a range of any of the above values (a range of from about 120 g/inch to about 300 g/inch, etc.), and a range that combines two integers that fall between two of the above-referenced values (i.e., a range of from about 115 g/inch to about 295 g/inch, etc.).

The conductive gel assembly 107 may be provided with any thickness $t_1$ that allows the conductive gel element 114 to function in accordance with the present disclosure. Non-limiting examples of thicknesses $t_1$ that may be utilized in accordance with the present disclosure include about 1 mil, about 5 mil, about 10 mil, about 15 mil, about 20 mil, about 25 mil, about 30 mil, about 35 mil, about 40 mil, about 45 mil, about 50 mil, about 55 mil, about 60 mil, about 65 mil, about 70 mil, about 75 mil, about 80 mil, about 85 mil, about 90 mil, about 95 mil, about 100 mil, or higher, as well as a range that combines any two of the above-referenced values (i.e., a range of from about 10 mil to about 50 mil, etc.), and a range that combines two integers that fall between two of the above-referenced values (i.e., a range of from about 12 mil to about 48 mil, etc.).

In some embodiments, the conductive gel assembly 107 and the conductive gel element 114 may have a shelf life of at least about six months. For example (but not by way of limitation), the conductive gel element 114 has a shelf life of at least about 9 months or at least about 12 months.

The one or more support layers 115 may be provided within the conductive gel element 114 (as shown in FIG. 4) or outside of the conductive element as shown in FIG. 3A. Generally, the one or more support layers 115 may be configured to provide reinforcement to the conductive gel element 114 to prevent lateral movement of the conductive gel element 114 when the conductive gel element 114 is applied to the skin of the patient. To that end, the one or more support layer 115 may provide strength and/or support to the one or more conductive gel layer 109 (e.g., conductive gel layers 109a and/or 109b). The one or more support layer 115 may be constructed of a woven or nonwoven material. In some embodiments, at least a portion of the one or more support layer 115 may include Reemay (i.e., spun nylon). In some embodiments, at least a portion or the entirety of the one or more support layer 115 may be constructed of a nonconductive material. In some embodiments, at least a portion or the entirety of the one or more support layer 115 may be constructed of a non-metal conductive material, such as carbon.

The support layer 115 may serve as an anchor between the conductive gel layer(s) 109 and one or more other components within the transducer array 100, such as the electrode elements 110 or the flex circuit 102 by attaching the support layer to the electrode elements 110 or the flex circuit 102, for example with a bond separate from any bond provided by the conductive gel layer(s) 109. In some embodiments, at least a portion of the support layer 115 may extend between at least two components of the transducer array 100, such as the electrode elements 110, or the conductive gel elements 114. For example, as illustrated in FIG. 3A, the support layer 115 extends between (fills the gaps between) individual electrode elements 110 and the individual conductive gel elements 114. In some embodiments, the conductive gel elements 114 may be positioned such that each conductive gel element 114 is aligned with one electrode element 110.

A gap may exist between each electrode element 110 such that each electrode element 110 is positioned at a distance from any adjacent electrode element 110. To that end, the conductive gel in liquid form or semi-solid conductive gel forming the conductive gel layer 109a and/or 109b may be dispensed onto the support layer 115 at pre-determined particular locations during formation of the transducer array 100 (e.g., corresponding to a single electrode element 110, corresponding to two electrode elements 110, corresponding to multiple electrode elements 110, and the like). In some embodiments, one or more dielectric materials may be positioned within the gap between adjacent isolated electrode elements 110, for example.

Additionally, a ring-shaped hydrogel barrier 116 (FIGS. 3A, 3F, and 3G) is optionally provided, surrounding each of the conductive gel elements 114. In general, the hydrogel barriers 116 help maintain the integrity of the conductive gel elements 114 throughout the duration of wear and prevent migration of the hydrogel from its correct location under the electrode elements 110. The hydrogel barriers 116 may be made, e.g., from MED 5695R, available from Vancive Medical Technologies, which is a polyethylene foam, and may be single-coated with WetStick™ synthetic rubber adhesive, also available from Vancive Medical Technologies. The hydrogel barriers 116 may be 500 micrometers thick and are preferably gamma sterilization-compatible.

To increase patient comfort, the transducer array 100 may optionally include a conformal foam layer 122 (FIGS. 3A and 3K) positioned beneath the flex circuit 102 and shaped to closely follow the branching configuration of the flex circuit 102. Note that unlike the flex circuit 102 (which has solid circular mounting pads 104 for the electrode elements 110), the foam layer 122 has ring-shaped regions 124 that surround the electrode elements 110 so as not to intervene between the electrode elements 110 and the patient's skin. A suitable thickness for the conformal foam layer 122 is on the order of 1 mm, and the foam layer 122 is preferably the same thickness as the electrode elements 110. The foam layer 122 preferably covers the entire surface of the flexible flex circuit 102 (except for the regions where the electrode elements 110 are positioned) while maintaining overall flexibility and conformability of the transducer array 100. But in alternative embodiments, the foam layer 122 only covers a portion of the surface of the flexible flex circuit 102. In some embodiments, the size of the foam layer 122 may be minimized to the extent possible so as not to reduce the overall breathability and fluid-vaporizing properties of the transducer array 100.

As discussed above, the conformal foam layer 122 may be made from polyethylene foam which may be affixed to the flex circuit 102 using a suitable adhesive. The foam layer 122 advantageously protects the patient from potentially sharp edges of the conductive traces on the flex circuit 102. This is particularly important in the context of flexible transducer arrays because flexing the transducer arrays 100 can cause the flat conductive traces to twist, which can cause the potentially sharp edges of those conductive traces to tilt down towards the patient's skin. Notably, interposing the foam layer 122 between the conductive traces of the flex circuit 102 and the patient's skin protects the patient from cuts and/or pain that might be caused by those potentially sharp edges.

The transducer array 100 also includes a skin-level layer of adhesive 118 disposed beneath the foam layer 122, as shown in FIGS. 3A, 3G, 3H, and 3J. In general, the skin-level layer of adhesive 118 follows the branching configuration of the flex circuit 102 and the foam layer 122, but with the various branches and trunk portions of the skin-level adhesive 118 being slightly wider than the corresponding portions of the flex circuit 102 and the foam layer 122 so as to at least partially overlap with the spaces between the branches of the flex circuit 102 and the foam layer 122. Notably, the skin-level adhesive 118 includes cutouts 120a along the branches of the adhesive, and cutouts 120b at the free ends of the branches of the adhesive (FIG. 3H). These cutouts 120a, 120b are shaped so as not to intervene between the electrode elements 110 or the conductive gel elements 114 and the patient's skin. The skin-level layer of adhesive 118 also functions as a constructive element, to stabilize the central area around the electrode elements 110 to prevent movement of the electrode elements 110 relative to the patient's skin.

The skin-level layer of adhesive 118 may be made from a polyester/rayon-blend, spunlace non-woven tape material such as 3M® 9917, which is 30 micrometers thick. The tape may be double-coated with acrylate adhesive, to provide a peel strength on the skin-facing side (e.g., 23 lbf/inch) and a higher peel strength (e.g., 27 lbf/inch) on the opposite, outer side. The material is preferably hypoallergenic, highly conformable, and breathable; with a high moisture vapor transmission rate; and it is preferably gamma sterilization-compatible. To prevent excessive sweating and moisture from being trapped under the transducer array 100, the overall surface area of the skin-level layer of adhesive 118 may be minimized, e.g., by making it just slightly wider than the corresponding portions of the flex circuit 102 and the foam layer 122.

Note that in embodiments where a conformal foam layer 122 is omitted, the layer of adhesive 118 would be connected directly to the flex circuit 102 with no intervening components disposed therebetween. Alternatively, in those embodiments where the conformal foam layer 122 is provided, the layer of adhesive 118 would be connected indirectly to the flex circuit 102, with a foam layer 122 disposed therebetween. In these embodiments, the foam layer 122 may be connected to the flex circuit 102 with a bonding material, such as an adhesive or a cohesive.

An exemplary embodiment of the support layer 115 is shown in FIGS. 3I and 3J. The support layer 115 (FIGS. 3A, 3I, and 3L) is positioned below and connected to an inner side of the flex circuit 102, the inner side 111a of the electrode elements 110 or combinations thereof. The support layer 115 has a number of slots 123, which divide the support layer 115 into a number of separate fingers 117, each of which is underneath a respective branch of the flex circuit 102. The support layer 115 is provided with eight slots 123a-h and ten fingers 117a-j (FIG. 3I). The slots 123a-h are preferably significantly narrower than the fingers 117a-j and the fingers 117a-j are preferably wider than the diameters of the electrode elements 110. This configuration results in the fingers 117a-j of the support layer 115 overlapping with the spaces between the branches of the flex circuit 102. The transducer array 100 may also be provided with an adhesive layer 118b positioned between the support layer 115 and the flex circuit 102 to anchor the support layer 115 to the flex circuit 102. The fingers 117a-j overlie and extend between (fill the gaps between) the conductive gel elements 114. The fingers 117a-j are connected to the conductive gel elements 114 and serve to provide lateral support for the conductive gel elements 114 so as to prevent the conductive gel elements 114 from moving laterally when the conductive gel elements 114 are applied to the skin of the patient. The flexible nature of the support layer 115 allow the fingers 117a-j to move independently of each other as the branches of the flex circuit 102 move independently of each other. This, in turn, helps to maintain conformability of the transducer array 100 and adhesion to the patient's skin even as the patient moves.

A top, covering adhesive-backed layer 126 (FIGS. 3A, 3L, and 3N) is positioned above and connected to an outer side of the flex circuit 102. The covering adhesive-backed layer 126 has a number of slots 128, which divide the covering adhesive-backed layer 126 into a number of separate fingers 130, each of which overlies a respective branch of the flex circuit 102. The slots 128 are preferably significantly narrower than the fingers 130 and the fingers 130 are preferably wider than the diameters of the electrode elements 110. This configuration results in the fingers 130 of the covering adhesive-backed layer 126 overlapping with the spaces between the branches of the flex circuit 102 to provide maximal adhesion of the covering adhesive-backed layer 126 to the patient's skin around the electrode elements, while still allowing the fingers 130 of the covering adhesive layer to move independently of each other as the branches of the flex circuit 102 move independently of each other. This, in turn, helps to maintain conformability of the transducer array 100 and adhesion to the patient's skin even as the patient moves. In addition, the covering adhesive-backed layer 126 preferably extends beyond the perimeter of the flex circuit 102 to provide additional adhesion to the skin at the outer boundary of the transducer array 100.

The covering adhesive-backed layer 126 may be made from 3M® 9916, which is a 100% polyester, spunlace non-woven tape. This material may be single-coated with acrylate adhesive on the skin-facing side, which adheres the covering adhesive-backed layer 126 to the outer surface of the flex circuit 102. The material forming the covering adhesive-backed layer 126 may have a thickness of 40 micrometers. The covering adhesive-backed layer 126 is preferably hypoallergenic, highly conformable, breathable, and gamma sterilization-compatible.

As shown in FIG. 3J, the support layer 115 may be shaped to be within the confines of the layer 126. Further, the support layer 115 may be shaped so that the fingers 117 of the support layer underlie and are aligned with fingers 130 of the layer 126 so that the fingers 117 move with the fingers 130.

Shown in FIG. 3P is a bottom plan view of a portion of the transducer assembly 100 depicting the support layer 115 adhered to the flex circuit 102 and positioned between the conductive gel element 114 and the flex circuit 102. In some embodiments, the transducer array 100 can be made by attaching the support layer 115 to the flex circuit 102 such that the electrode elements 110 are between the support layer 115 and the flex circuit 102. In this position, the conductive gel elements 114 can be applied in liquid form to the support layer 115 directly over the electrode elements 110 and then cured. In this embodiment, at least some of the liquid forming the conductive gel elements 114 may pass through the support layer 115 thereby forming the layers 109a and 109b encapsulating the support layer 115 in the conductive gel elements 114 when cured. Further, the conductive gel elements 114, when cured, may adhere to the electrode elements 110 thereby providing further lateral support to the conductive gel elements 114 separate from the adhesive layer 118b attaching the support layer 115 to the flex circuit 102. In some embodiments, the support layer 115 can be anchored to the flex circuit 102 in a manner other than an adhesive. For example, a mechanical linkage such as thread, staple, or rivet can be used to connect the support layer 115 to the flex circuit 102.

Notably and advantageously, two separate factors contribute to the adhesion of the entire transducer array 100 to the patient's skin. The first factor is the portions of the lower surface of the top adhesive layer 126 that contact the skin through the spaces between the branches of the flex circuit 102 and beyond the perimeter of the flex circuit 102. The second factor is the layer of adhesive 118a disposed between the foam layer 122 and the person's skin (or, between the flex circuit 102 and the person's skin in those embodiments that do not include the foam layer 122). The inclusion of these two separate adhesive components provides significantly improved adhesion of the transducer array 100 to the patient's skin. This feature of the transducer array 100 enhances the degree of adhesion of the transducer array 100 to the patient's skin around the electrode elements, resulting in prolonged and better skin/electrode contact as compared to configurations in which the only adhesion was provided by an adhesive-backed patch overlying the entire transducer array.

In some embodiments, the covering adhesive-backed layer 126 includes a central aperture 135 and a slit 132 extending from the innermost end 129 of one of the slots 128—in particular, the innermost slit-end that is closest to the central aperture 135 (FIG. 3L). The central aperture 135 permits an electrical cable 134 (shown in FIG. 3N) that protrudes from the back surface of the flex circuit 102 to extend through the covering adhesive-backed layer 126. This electrical cable 134 is used to connect the flex circuit 102 to a Tumor Treating Fields therapy controller (not illustrated) via a connector. The slit 132 is useful for positioning the covering adhesive-backed layer 126 over the flex circuit 102 after the cable 134 has been connected to the flex circuit 102 during the assembly process. In particular, portions of the covering adhesive-backed layer 126 can be moved away from each other to open the slit 132, such that the covering adhesive-backed layer 126 can be passed around the electrical cable 134 on either side and then the entire adhesive-backed layer can be pressed into proper position.

Once the transducer array 100 has been properly attached to the patient's skin with the covering adhesive-backed layer 126 securing the transducer array 100 in place, the central aperture 135 may be covered, for protection, with a top adhesive-backed slot-cover 136 (FIGS. 3A, 3M, and 3N). The slot-cover 136 may be a disc-shaped item, formed from the same material and in the same manner as the covering adhesive-backed layer 126. In some preferred embodiments, the slot cover 136 includes a slot 138 for the electric cable 134 to pass through.

In some preferred embodiments, the entire assembly of components described above is protected, prior to use on a patient, with a two-part release liner 140 (FIGS. 3A and 3O).

In the FIGS. 3A-3O embodiment of a transducer array 100 described above, there are twenty electrode elements arranged in five rows, with two, five, six, five, and two electrode elements in each of the successive rows. The rows correspond with the branches of the flex circuit 102 and are perpendicular to the longitudinal direction in which the trunk 108 extends. Thus, the rows are oriented horizontally and the trunk 108 is oriented vertically as the transducer array 100 is oriented in FIG. 3A and the flex circuit 102 is oriented in FIG. 3B. Depending on factors such as the size, sex, age, etc. of a patient, however, there could be more or less electrode elements 110 arranged in different configurations while still adhering to the inventive concepts disclosed herein.

In the FIGS. 3A-3P embodiment, the flex circuit 102 has a plurality of branches extending on each lateral side of the trunk region, but in alternative embodiments, the branches may be present only on a single lateral side of the trunk region (in which case the trunk region would be located near one edge of the apparatus).

In some embodiments (including but not limited to the FIGS. 3A-3P embodiment) the flex circuit 102 is configured so that no more than three paths emanate from any given intersection on the flex circuit 102. This is best explained in connection with FIG. 3B, from which it is apparent that one path of the flex circuit 102 emanates from the intersections at the mounting pads 104a, two paths of the flex circuit 102 emanate from the intersections at the mounting pads 104b, and three paths of the flex circuit emanate from the intersections at the mounting pads 104c. Notably, there are no intersections on the flex circuit 102 from which more than three paths emanate. This holds true for both the intersections that are positioned at the mounting pads 104, and also for intersections that are not positioned at one of the mounting pads 104 (e.g., The T-shaped intersections 105).

In some preferred embodiments, including the FIGS. 3A-3P embodiments, all segments of the flex circuit 102 are straight.

In some preferred embodiments, including the FIGS. 3A-3P embodiment, an electrical cable terminates on the flex circuit 102 (as best seen in FIG. 3N). Optionally, in these embodiments (as best seen in FIG. 3B), segments of the flex circuit 102 near the distal end of each branch are thinner than at least some of the segments of the flex circuit 102 that are adjacent to the location where the electrical cable terminates (e.g., segment 108d). This configuration increases the flexibility of the flex circuit, which also contributes to improving the flexibility of the entire apparatus.

Figure 5:
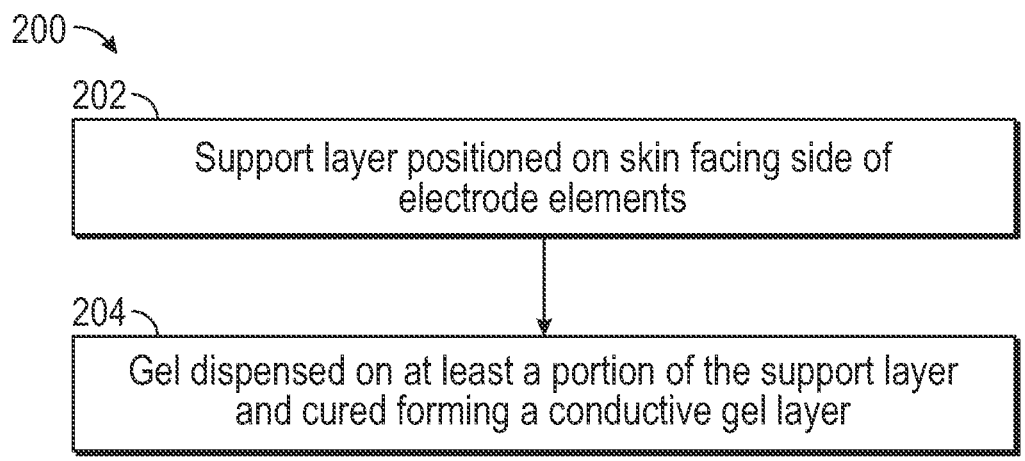
FIG. 5 is a flow chart of an exemplary method of forming conductive gel layers in accordance with the present disclosure.

FIG. 5 illustrates a flow chart 200 of an exemplary method of forming the exemplary conductive gel elements 114 in accordance with the present disclosure. In a step 202, the support layer 115 may be positioned on and optionally anchored to the electrode elements 110 and the flex circuit 102. In a step 204, conductive gel (in liquid form) or semi-solid conductive gel may be dispensed in a predetermined pattern on at least a portion of the support layer 115 and cured (e.g., UV curing, electron beam curing) to form the conductive gel elements 114. In forming the conductive gel elements 114, the conductive gel or semi-solid conductive gel may be dispensed at one or more pre-determined targeted locations onto the electrode elements 110. The electrode elements 110 may be provided in a predetermined pattern and have a predetermined size. In these embodiments, the pre-determined targeted locations where conductive gel will be dispensed may correspond to the predetermined pattern and predetermined size of the electrode elements 110 so that when the conductive gel elements 114 are installed on the electrode elements 110, the conductive gel elements 114 each correspond to at least one electrode element 110. In some embodiments, a mold and/or spacer may be used to provide for dispensing of the conductive gel (in liquid form) or semi-solid conductive gel at the one or more pre-determined targeted locations. In some embodiments, the conductive gel elements 114 may have a surface area that overlaps about 75% to about 100% of the surface area of the particular electrode element 110. In some embodiments, the conductive gel elements 114 may have a surface area that overlaps about 50% to about 100% of the surface area of the particular electrode element 110.

In some embodiments, the generator 32, connected to the transducer array 100, may supply a first electric signal having a first power and a first frequency to a first group of one or more electrode elements 110 at a first instance in time to generate a first Tumor Treating Field. At a second instance in time, the generator 32 may supply a second electric signal having a second power, the same as or different from the first power, and a second frequency, the same as or different from the first frequency, to a second group of electrode elements 110 to generate a second Tumor Treating Field. The first Tumor Treating Field and the second Tumor Treating Field may target the same target area or may target different target areas. In one embodiment, the first instance in time and the second instance in time may overlap, that is, the generator 32 may supply the second electric signal to the second group while also supplying the first electric signal to the first group. In such an embodiment, the first group and the second group may be mutually exclusive.

In some embodiments, the generator 32, connected to the transducer array 100, may supply a first electrical signal having a first power and a first frequency to a first group of one or more electrode element 110 and supply a second electrical signal having a second power and a second frequency to a second group of electrode elements 110 at the same instance in time. That is, the generator 32 may simultaneously supply the first electric signal to the first group and the second electric signal to the second group. While the above embodiments describe only the first group and the second group, it is understood that there may be more than two groups. In one embodiment, the number of groups is dependent on the number of combinations of the electrode elements 110.

Referring again to FIG. 2, in some embodiments, leads 34a and 34b may include a DC blocking component, such as blocking capacitors 160a and 160b. Blocking capacitors may be operable to block direct electrical current from passing to the pads 42a and 42b. The blocking capacitors 160a and 160b pass AC voltage to the pads 42a and 42b and may be operable to prevent DC voltage or DC offset generated by the generator 32 or otherwise present in the electrical signal from passing to or through the patient. In some embodiments, the blocking capacitors 160a and 160b may be non-polarized capacitors. In some embodiments, the blocking capacitors 160a and 160b may have a capacitance of about 1 µF. In some embodiments, the blocking capacitor is a Goldmax, 300 Series, Conformally Coated, X7R Dielectric, 25-250 VDC (Commercial Grade) leaded non-polarized ceramic capacitor, available from KEMET Electronics Corporation, having a principal place of business in Fort Lauderdale, Florida, USA.

In some embodiments, the blocking capacitors 160a and 160b may be a component of the leads 34a and 34b or an additional component at any position between the electrode element 110 of the first pad 42a and second pad 42b and the generator 32. For example, the blocking capacitors 160a and 160b may be intermediate the second end 40a of the first conductive lead 34a and the generator 32, or intermediate the first end 36b of the second conductive lead 34b and the second pad 42b (FIG. 2). In some embodiments, one or more blocking capacitor 160a and 160b may be provided remote from the pads 42a and 42b. For example, one or more blocking capacitors 160a and 160b may be located on a non-patient side of the electrode element 110.

Certain non-limiting embodiments of the present disclosure are related to kits that include components of the Tumor Treating Field generating systems, such as the electronic apparatus 30, described herein. In some embodiments, one or more of the pads 42a and 42b or transducer array 100 may be packaged as part of a kit. In some embodiments, the kit may include the first pad 42a and the lead 34a connected to the electrode elements 110. In some embodiments, the kit may include the first pad(s) 42a and the second pad(s) 42b, the transducer array 100, and the leads 34a and 34b. In some embodiments, the lead 34a may be mechanically coupled to the first pad 42a, and the second conductive lead 34b may be mechanically coupled to the second pad 42b, for example, by a rivet, by solder, by adhesive, by welding, and/or other electrically conductive coupling means. In some embodiments, the kit may further include the blocking capacitor(s) 160a or 160b positioned such that the electric signal passes through the blocking capacitor 160a or 160b.

Figure 6:
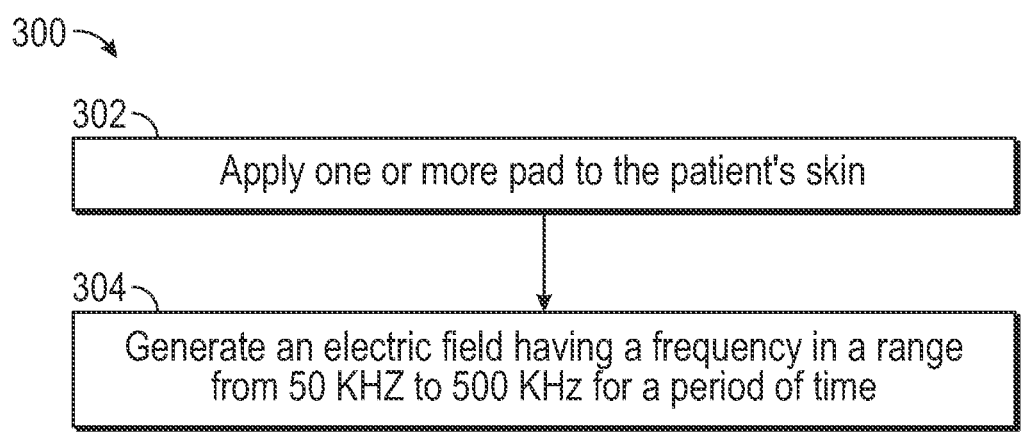
FIG. 6 is a flow chart of an exemplary method of using an electronic apparatus in accordance with the present disclosure.

Referring now to FIG. 6, shown therein is a flow chart 300 of an exemplary method of using the electronic apparatus 30 and the transducer array 100 to apply a Tumor Treating Field to a patient. In a step 302, the transducer array 100 may be attached to the skin of a patient. For example, electrode elements 110 may be attached to the skin of the patient on opposite sides of a tumor. In the context of a brain tumor, electrodes 110 may be positioned either side of the center of the patients head. For example, one of the electrode elements 110 may be positioned on the right side of the patient's head, and another one of the electrode elements 110 may be positioned on the left side of the patient's head. One or more electrode elements 110 may be applied to the patient's skin by a user.

In a step 304, an AC voltage is applied between the electrode elements 110. For example, the generator 32 provides an alternating electric field having a frequency in a range of from about 50 kHz to about 500 kHz for a period of time to the electrode elements 110 applied to the patient to deliver Tumor Treating Fields to the patient. In some embodiments, a user may initiate generation of the generator 32 via the control box 44. In some embodiments, application of the AC voltage may be performed more than one time in the period of time. Duration of multiple instances of application of AC voltage may be similar or different. In some embodiments, a period of time of non-application of AC voltage may be between application of AC voltage.

Variable Resistivity Conductive Gel Element(s).

Figure 7A:
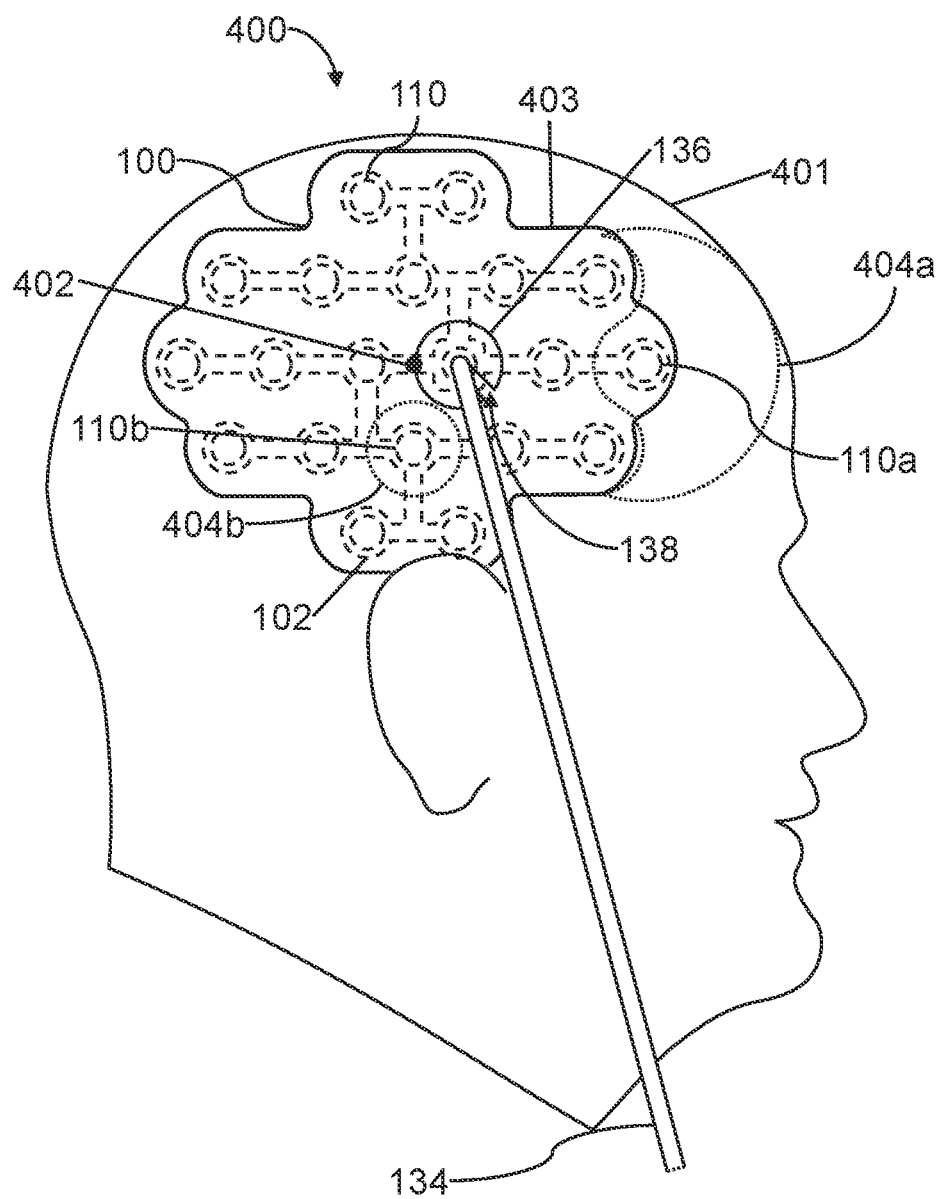
FIG. 7A is a perspective view of an exemplary transducer array having a plurality of electrically balanced electrode elements positioned on and electrically coupled to a body part of the patient in accordance with the present disclosure.

Shown in FIG. 7A is a perspective view of the transducer array 100 positioned on a body part 401 of a patient 400. In the example shown in FIG. 7A, the body part 401 is the head. However, it is to be understood that the body part 401 may be other part(s) of the patient 400, such as the chest, back, elbow, knee, etc. Only one of the electrode elements 110 is labeled with the reference numeral 110 for purposes of brevity. In the embodiment shown in FIG. 7A, the transducer array 100 is provided with the slot cover 136 that includes the slot 138 for the electrical cable 134 to connect to the flex circuit 102. To increase comfort for the patient 400, it is preferable that the electrical cable 134 is limited in size and unaccompanied by many other cables.

When electricity is supplied to the flex circuit 102 via the electrical cable 134 and a first electrode element 110a supplies more electrical current to the body part 401 of the patient 400 than a second electrode element 110b, more heat may be generated by the first electrode element 110a than the second electrode element 110b as a result. As will be discussed below, it is desirable for all the electrode elements 110 to supply a similar amount of electrical current to the body part 401 of the patient 400 when electricity is supplied to the flex circuit 102 so that all the electrode elements 110 may generate a similar amount of heat such that the electrode elements 110 may have a similar temperature while supplying electrical current. The amount of electrical current a particular electrode element 110 is able to supply may depend on a number of factors, some of which will be discussed below. In accordance with the present disclosure, conductive gel elements having a resistance based upon the location of the conductive gel element within the transducer array are provided to passively balance the electrical current between the various electrode elements 110.

In certain embodiments, the transducer array 100 has a center of mass 402 and an outer perimeter 403. The center of mass 402 is a position defined relative to one or more of the electrode elements 110 and is an average of the positions of all the electrode elements 110 in the transducer array 100 weighted according to the mass(es) of each of the electrode elements 110. Where the first electrode element 110a is located a greater distance from the center of mass 402 and/or a lesser distance from the outer perimeter 403 than is a second electrode element 110b, the first electrode element 110a is able to supply more electrical current to the body part 401 of the patient 400 than the second electrode element 110b, and the first electrode element 110a generates more heat than the second electrode element 110b as a result. As will be explained below, to passively balance the electrical current supplied by the first electrode element 110a and the second electrode element 110b, a first conductive gel element (e.g., first region of conductive gel) is positioned in between the first electrode element 110a and the body part 401, and a second conductive gel element (e.g., second region of conductive gel) is positioned in between the second electrode element 110b and the body part 401, the first conductive gel element or first region has a higher electrical resistance than the second conductive gel element or second region.

In certain embodiments, each of the electrode elements 110 has an active surface area 404 (i.e., a region of the surface of the body part 401 of the patient 400 surrounding a particular electrode element 110 in which the particular electrode element 110 is able to supply electrical current). The active surface areas 404a-b of the electrode elements 110a-b are illustrated in FIG. 7A for purposes of clarity. The active surface area 404 of a particular electrode element 110 may extend outward from the particular electrode element 110 unless and/or until the active surface area 404 intersects the active surface area 404 of another electrode element 110 located substantially adjacent to the particular electrode element 110 (also referred to as a "neighbor electrode element" of the particular electrode element 110). Therefore, the size of the active surface area 404 of each of the electrode elements 110 may be determined by the spacing between the electrode elements 110, the position of a particular electrode element 110 in the transducer array 100, and/or the number of neighbor electrode elements possessed by the particular electrode element 110. Where a first active surface area 404a of the first electrode element 110a is larger than a second active surface area 404b of the second electrode element 110b, the first electrode element 110a is able to supply more electrical current to the body part 401 of the patient 400 than the second electrode element 110b, and the first electrode element 110a generates more heat than the second electrode element 110b as a result. In these embodiments, to passively balance the electrical current supplied by the first electrode element 110a and the second electrode element 110b, a first conductive gel element (or first region) is positioned in between the first electrode element 110a and the body part 401, and a second conductive gel element (or second region) is positioned in between the second electrode element 110b and the body part 401. The first conductive gel element of first region has a higher electrical resistance than the second conductive gel element or second region.

For example, as illustrated in FIG. 7A, the first active surface area 404a of the first electrode element 110a located in an exterior region of the transducer array 100 may be relatively large because the first electrode element 110a possesses only three neighbor electrode elements located on only one side of the first electrode element 110a, while the second active surface area 404b of the second electrode element 110b located in an interior region of the transducer array 100 may be relatively small (i.e., smaller than the first active surface area 404a) because the second electrode element 110b possesses six neighbor electrode elements surrounding the second electrode element 110b. Therefore, the first electrode element 110a is able to supply more electrical current to the body part 401 of the patient 400 than the second electrode element 110b, and the first electrode element 110a generates more heat than the second electrode element 110b as a result.

For example (but not by way of limitation), the similar amount of electrical current supplied by each of the electrode elements 110 when passively balanced may be within about 0.1 mA, about 0.5 mA, about 1 mA, about 2 mA, about 3 mA, about 4 mA, about 5 mA, about 6 mA, about 7 mA, about 8 mA, about 9 mA, about 10 mA, about 15 mA, about 20 mA, about 25 mA, about 30 mA, about 35 mA, about 40 mA, about 45 mA, or about 50 mA, as well as any range that combines any two of the above-referenced values (i.e., a range of from about 0.1 mA to about 25 mA, a range of from about 1 mA to about 50 mA, etc.), and a range that combines two integers that fall between two of the above-referenced values (i.e., a range of from about 12 mA to about 48 mA, etc.).

For example (but not by way of limitation), the similar temperature supplied by each of the electrode elements 110 when passively balanced may be within 0.1 degree C., about 0.2 degree C., about 0.5 degree C., about 0.7 degree C., about 1.0 degree C., about 1.2 degree C., about 1.4 degree C., about 1.6 degree C., about 1.8 degree C., about 2 degree C., about 2.2 degree C., about 2.4 degree C., or about 2.5 degree C., as well as any range that combines any two of the above-referenced values (i.e., a range of from about 0.1 degree C. to about 1.4 degree C., a range of from about 1 degree C. to about 2 degree C., etc.), and a range that combines two integers that fall between two of the above-referenced values (i.e., a range of from about 0.6 degree C. to about 2.3 degree C., etc.).

In certain embodiments, the transducer array 100 has a number of electrode areas, each of the electrode areas having an electrode density. The electrode density of each of the electrode areas may be defined as the number of electrode elements 110 in the electrode area, and/or may depend on the number of neighbor electrode elements possessed by each of the electrode elements 110 in the electrode area, and/or the spacing between the electrode elements 110 in the electrode area. Where an electrode area in which a first electrode element 110*a* is located has a lower electrode density than an electrode area in which a second electrode element 110*b* is located, the first electrode element 110*a* is able to supply more electrical current to the body part 401 of the patient 400 than the second electrode element 110*b*, and the first electrode element 110*a* generates more heat than the second electrode element 110*b* as a result. In these embodiments, to passively balance the electrical current supplied by the first electrode element 110*a* and the second electrode element 110*b*, a first conductive gel element (e.g., first region of conductive gel) is positioned in between the first electrode element 110*a* and the body part 401, and a second conductive gel element (e.g., second region of conductive gel) is positioned in between the second electrode element 110*b* and the body part 401. The first conductive gel element or first region of conductive gel has a higher electrical resistance than the second conductive gel element or second region of conductive gel.

For example, as illustrated in FIG. 7A, the electrode density of the electrode area in which the first electrode element 110*a* is located may be relatively low because the first electrode element 110*a* possesses only three neighbor electrode elements located on only one side of the first electrode element 110*a*, while the electrode density of the electrode area in which the second electrode element 110*b* is located may be relatively high (i.e., higher than the electrode density of the electrode area in which the first electrode element 110*a* is located) because the second electrode element 110*b* possesses six neighbor electrode elements surrounding the second electrode element 110*b*. Therefore, the first electrode element 110*a* is able to supply more electrical current to the body part 401 of the patient 400 than the second electrode element 110*b*, and the first electrode element 110*a* generates more heat than the second electrode element 110*b* as a result.

Figure 7B:
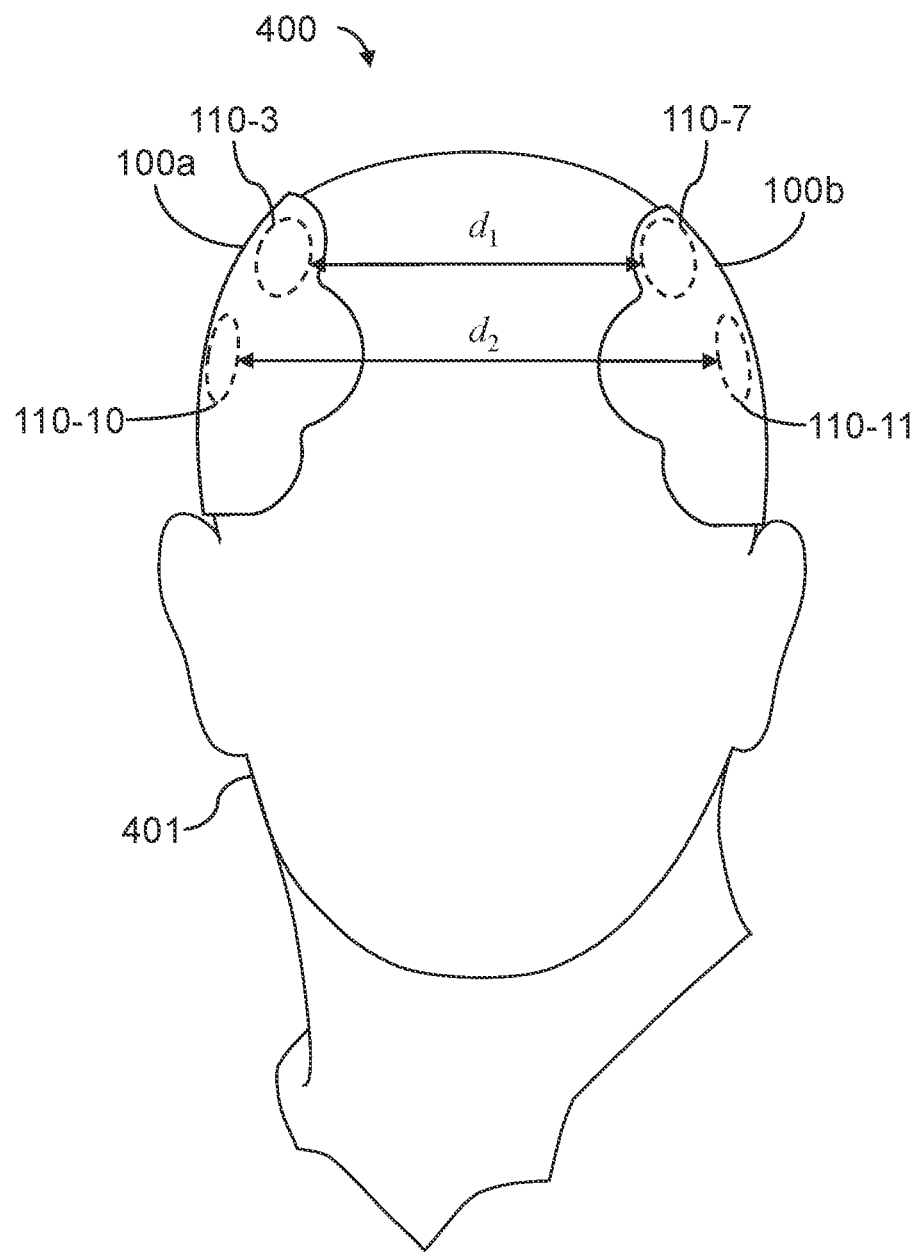
FIG. 7B is a perspective view of a pair of exemplary transducer arrays having a plurality of balanced electrode elements positioned on and electrically coupled to opposite sides of the body part (i.e., the head) of the patient.

Shown in FIG. 7B is a perspective view of an embodiment of the present disclosure in which a pair of transducer arrays 100*a*-*b* are positioned on opposite sides of the body part 401 (i.e., the head) of the patient 400. A first electrode element 110-3 and a second electrode element 110-10 of the first transducer array 100*a* and a first corresponding electrode element 110-7 and a second corresponding electrode element 110-11 of the second transducer array 100*b* are illustrated in FIG. 7B for purposes of clarity.

In certain embodiments, each of the electrode elements 110 of the first transducer array 100*a* is spaced a distance d from the corresponding electrode elements 110 of the second transducer array 100*b*. Where a first distance $d_1$ between the first electrode element 110-3 and the first corresponding electrode element 110-7 is greater than a second distance $d_2$ between the second electrode element 110-10 and the second corresponding electrode element 110-11, the first electrode element 110-3 and the first corresponding electrode element 110-7 are able to supply more electrical current to the body part 401 of the patient 400 than the second electrode element 110-10 and the second corresponding electrode element 110-11; and the first electrode element 110-3 and the first corresponding electrode element 110-7 generate more heat than the second electrode element 110-10 and the second corresponding electrode element 110-11 as a result.

In accordance with the present disclosure, the electrical current and/or capacitive coupling between certain pairs of electrode elements (e.g., between the first electrode element 110-3 and the first corresponding electrode element 110-7 and/or between the second electrode element 110-10 and the second corresponding electrode element 110-11) is passively controlled by the application of a conductive gel layer 405 having a number of different regions (i.e., regions 422*a*-*c*, 430*a*-*c*, 434*a*-*c*, and 438*a*-*c* shown in FIGS. 9-12A and discussed in more detail below), each of the regions having a different resistance, that are applied between particular electrode elements 110 of the transducer arrays 100*a*-*b* and the body part 401 of the patient 400. In the embodiment shown in FIG. 7B, the first electrode element 110-3 and the first corresponding electrode element 110-7 are located a greater distance from the center of mass 402 of each of the transducer arrays 100*a*-*b* and in electrode areas of lower electrode density, while the second electrode element 110-10 and the second corresponding electrode element 110-11 are located a lesser distance from the center of mass 402 of each of the transducer arrays 100*a*-*b* and in electrode areas of higher electrode density. In accordance with the present disclosure, in order to balance the higher current (and heat) produced at the first electrodes, the regions of the conductive gel layer 405 applied between the first electrode element 110-3 and the body part 401 of the patient 400 (or between the first corresponding electrode element 110-7 and the body part 401 of the patient 400) may have a higher resistance than the regions of the conductive gel layer 405 applied between the second electrode element 110-10 and the body part 401 of the patient 400 (or between the second corresponding electrode element 110-11 and the body part 401 of the patient 400).

For example (but not by way of limitation), the resistance of the regions of the conductive gel layer 405 applied to electrode elements 110 located closer to the center of mass 402 (second electrodes) may be in a range of ⅕ to ½ of the resistance of the regions applied to electrode elements 110 located further from the center of mass 402 (first electrodes). The resistance of the regions applied to electrode elements 110 located closest to the center of mass 402 may be about 5 Ohms, about 10 Ohms, about 15 Ohms, about 20 Ohms, about 25 Ohms, about 30 Ohms, about 35 Ohms etc., as well as any range that combines any two of the above-referenced values (i.e., a range from about 5 Ohms to about 15 Ohms, a range from about 10 Ohms to about 20 Ohms, etc.), and a range that combines two integers that fall between two of the above-referenced values (i.e., a range from about 12 Ohms to about 22 Ohms, etc.). The resistance of the regions applied to electrode elements 110 located farther from the center of mass 402 may be about 10 Ohms, about 20 Ohms, about 30 Ohms, about 40 Ohms, about 50 Ohms, about 60 Ohms, about 70 Ohms, about 80 Ohms, about 90 Ohms, etc., as well as any range that combines any two of the above-referenced values (i.e., a range from about 10 Ohms to about 30 Ohms, a range from about 20 Ohms to about 40 Ohms, etc.), and a range that combines two integers that fall between two of the above-referenced values (i.e., a range from about 32 Ohms to about 52 Ohms, etc.). In some embodiments, the resistance of the regions applied to electrode elements 110 located closest to the center of mass 402 may be about 20 Ohms, and the resistance of the regions applied to electrode elements 110 located farthest from the center of mass may be about 60 Ohms.

Figure 8:
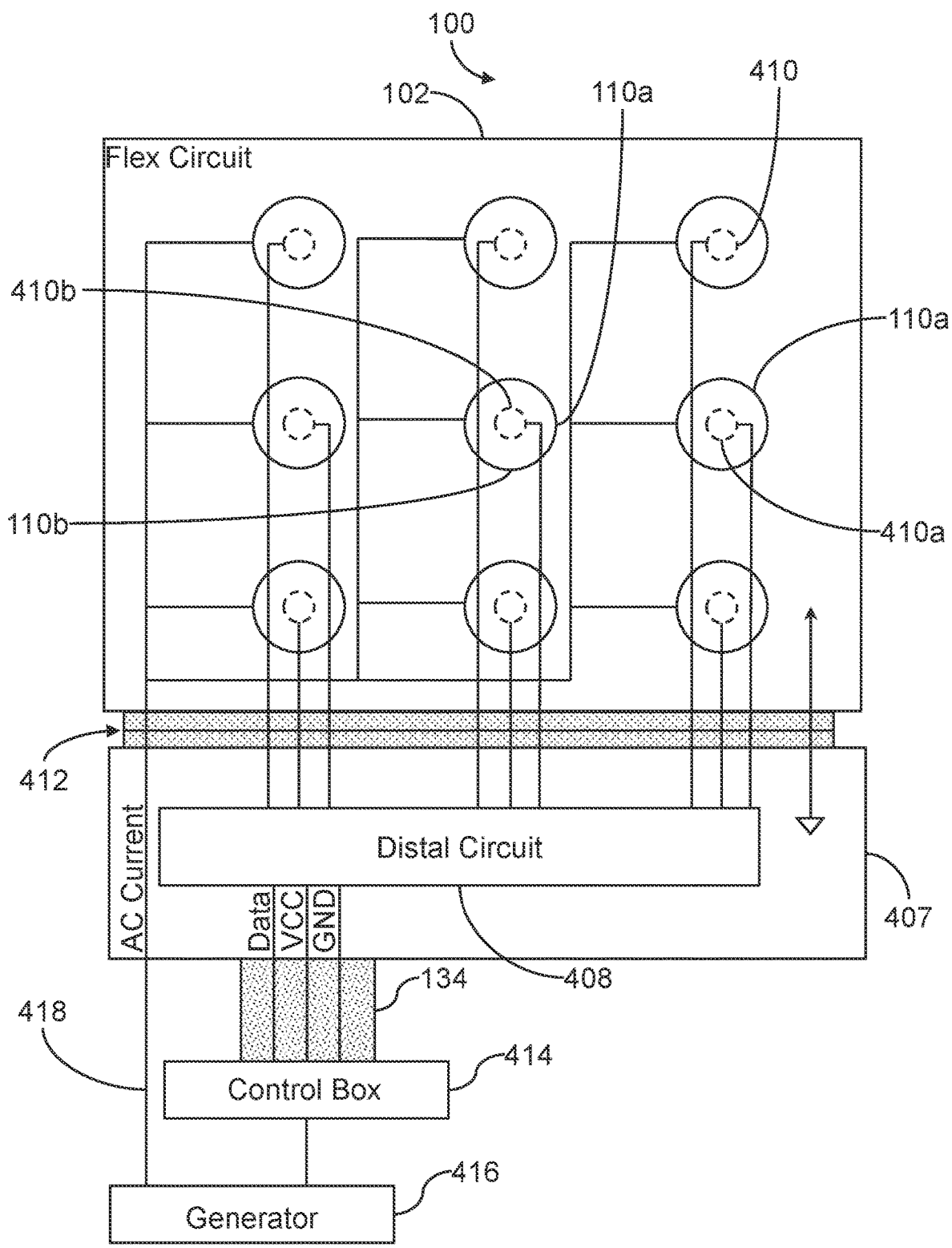
FIG. 8 is a circuit diagram showing an exemplary flex circuit having a plurality of the electrode elements and temperature sensors connected to a module via a connector.

Referring now to FIG. 8, in some embodiments, a module 407 may be mounted (e.g., either directly or through intervening components) to a second end of the electrical cable 134. A distal circuit 408 may be mounted in the module 407 to obtain one or more temperature readings from one or more temperature sensors 410 associated with the electrode elements 110. A connector 412 may be included between the module 407 and the flex circuit 102. Features including the connector 412, the distal circuit 408, and the module 407 are further disclosed in detail in U.S. Provisional Patent Application No. 63/085,733, filed Sep. 30, 2020, entitled "Connector for Detachable Array", and in U.S. patent application Ser. No. 17/490,120, filed Sep. 30, 2021, entitled "Connector for Detachable Array", which are hereby incorporated in their entirety.

The distal circuit 408 may convert (e.g., analog to digital) the temperature readings, forward the temperature readings, and/or send the temperature readings to a control box 414. The control box 414 may then forward the temperature readings and/or send the temperature readings to a generator 416 (e.g., via a serial communication link). In some embodiments, the generator 416 may determine, based on the temperature readings, adjustment of the electrical current to the transducer array 100. In some embodiments, such as in FIG. 8, the electrical current is supplied to the transducer array 100 via a conductor 418. The conductor 418 may be electrically connected to all the electrode elements 110 in the transducer array 100. In this embodiment, adjustments to the electrical current supplied to the transducer array 100 via the conductor 418 are supplied to all the electrode elements 110. Thus, the hottest electrode element 110 in the transducer array 100 in effect controls the amount of electrical current supplied to all the electrode elements 110 in the transducer array 100. By configuring the electrode elements 110 to generate similar amounts of heat such that electrode elements 110 have a similar temperature when supplying electrical current provides benefits including, but not limited to, enhanced total electrical current supplied to the body part 401 of the patient 400 while also enhancing patient comfort.

While only nine electrode elements 110 are shown in FIG. 8 for purposes of clarity, it is to be understood that the present disclosure encompasses transducer arrays 100 having more than two, or more than nine, electrode elements 110. The electrode elements 110 are arranged in the flex circuit 102 in parallel so as to simultaneously and continuously receive the same alternating electrical current signal. Therefore, where the temperature reading from a first temperature sensor 410a associated with a first electrode element 110a exceeds a preset limit (e.g., 41 degrees C.), the electrical current supplied to the entire flex circuit 102 must be limited, even if the temperature reading from a second temperature sensor 410b associated with a second electrode element 110b does not meet the preset limit. This may reduce the overall effectiveness of the flex circuit 102 and/or the transducer array 100.

Figure 9:
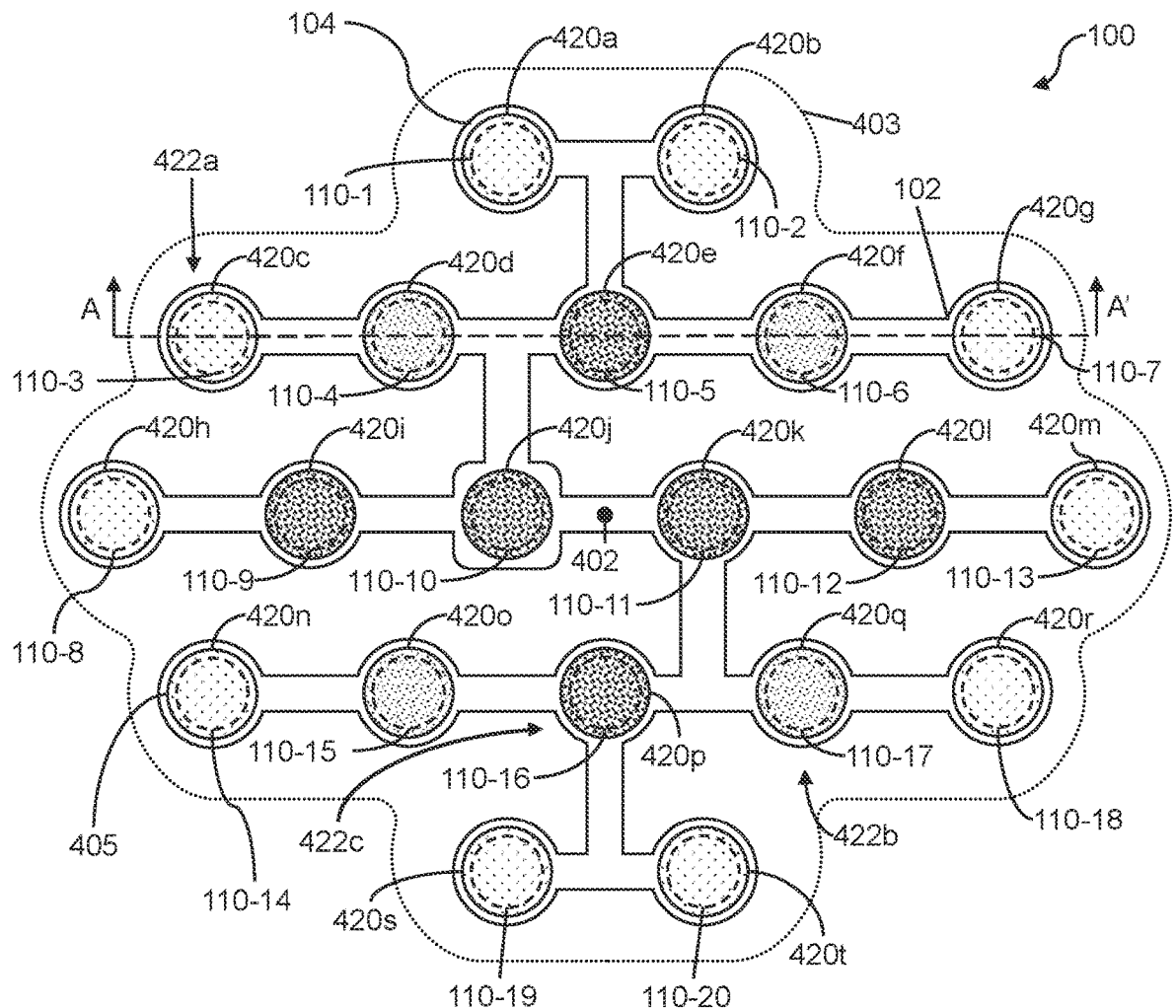
FIG. 9 is a plan view of the flex circuit having a plurality of conductive gel elements arranged into distinct conductive gel groups, each of the conductive gel groups having a different fixed resistance.

Referring now to FIG. 9, shown therein is a plan view of the flex circuit 102, according to an embodiment of the present disclosure, as "seen" by the patient's skin. The flex circuit 102 may have the electrode elements 110 disposed on the inner (i.e., skin-facing) side of the mounting pads 104 of the flex circuit 102. The electrode elements 110 are labeled in FIG. 9 with the reference numerals 110-1 to 110-20 for purposes of clarity. Only one of the mounting pads 104 is labeled for purposes of brevity.

In the embodiment shown in FIGS. 9, 9A, 9B, 9C, and 9D, the conductive gel layer 405 is applied to the inner (i.e., skin-facing) side of the electrode elements 110-1 to 110-20. In this embodiment, the regions of the conductive gel layer 405 are implemented as conductive gel elements 420a-t that are distinct and belong to a plurality of conductive gel groups 422a-c (shown in three different shadings in FIG. 9), each of the conductive gel groups 422a-c including at least one conductive gel element 420. Only one conductive gel element 420 is labeled with the reference numeral 405 for purposes of brevity.

While FIGS. 9, 9A, 9B, 9C, and 9D depict an embodiment of the present disclosure wherein the plurality of conductive gel groups 422a-c includes a first conductive gel group 422a, a second conductive gel group 422b, and a third conductive gel group 422c, other embodiments may include only two conductive gel groups, or more than three conductive gel groups. In this example, conductive gel elements 420a, 420b, 420c, 420g, 420h, 420m, 420n, 420r, 420s, and 420t are within the first conductive gel group 422a; conductive gel elements 420d, 420f, 420o, and 420q are within the second conductive gel group 422b; and conductive gel elements 420e, 420i, 420j, 420k, 420l, and 420p are within the third conductive gel group 422c.

In the arrangement shown in FIGS. 9, 9A, 9B, 9C, and 9D, each of the conductive gel elements 420 in the first conductive gel group 422a is applied on an electrode element 110 possessing three neighbor electrode elements; each of the conductive gel elements 420 in the second conductive gel group 422b is applied on an electrode element 110 possessing five neighbor electrode elements; and each of the conductive gel elements 420 in the third conductive gel group 422c is applied on an electrode element 110 possessing six neighbor electrode elements. However, it will be understood that the conductive gel elements 420a-t of each of the conductive gel groups 422a-c may be applied on electrode elements 110 possessing any number of neighbor electrode elements, as long as the conductive gel elements 420 in the first conductive gel group 422a are applied on electrode elements 110 possessing fewer neighbor electrode elements than the conductive gel elements 420 in the second conductive gel group 422b, the conductive gel elements 420 in the third conductive gel group 422c are applied on electrode elements 110 possessing fewer neighbor electrode elements than conductive gel elements 420 in the second conductive gel group 422b, if applicable, and so on.

In certain embodiments, the conductive gel elements 420 in the first conductive gel group 422a may be positioned a first distance from the center of mass 402, the conductive gel elements 420 in the second conductive gel group 422b may be positioned a second distance from the center of mass 402, the first distance being greater than the second distance, and the conductive gel elements in the third conductive gel group 422c may be positioned a third distance from the center of mass 402, the second distance being greater than the third distance. In other embodiments, the conductive gel elements 420 in the first conductive gel group 422a may be located in an electrode area having a first electrode density, while the conductive gel elements 420 in the second conductive gel group 422b may be located in an electrode area having a second electrode density greater than the first electrode density, and the conductive gel elements in the third conductive gel group 422c may be located in an electrode area having a third electrode density greater than the second electrode density.

The conductive gel elements 420a-t in each conductive gel group 422a-c may have a similar resistance, but conductive gel elements 420a-t in different conductive gel groups 422a-c may have a different resistance. For example, the conductive gel element 420a may have a similar resistance as the conductive gel element 420b, for example, and may also have a higher resistance than the conductive gel element 420d, for example. The conductive gel element 420d may have a similar resistance as the conductive gel element 420f, for example, but may have a higher resistance than the conductive gel element 420j. The conductive gel elements 420e, 420i, 420j, 420k, 420l, and 420p may have similar resistances. For example (but not by way of limitation), the similar resistance of the conductive gel elements 420a-t in the first conductive gel group 422a may be about 60 Ohms, while the similar resistance of the conductive gel elements 420a-t in the second conductive gel group 422b may be about 40 Ohms, and the similar resistance of the conductive gel elements 420a-t in the third conductive gel group 422c may be about 20 Ohms.

The similar resistance of the regions applied to electrode elements 110 in the same conductive gel groups 422a-c, may be about 0.2 Ohms, about 0.4 Ohms, about 0.6 Ohms, about 0.8 Ohms, about 1 Ohms, about 1.2 Ohms, about 1.4 Ohms, about 2 Ohms, about 3 Ohms, about 4 Ohms, about 5 Ohms, about 6 Ohms, about 7 Ohms, about 8 Ohms, about 9 Ohms, about 10 Ohms, about 15 Ohms as well as any range that combines any two of the above-referenced values (i.e., a range from about 1 Ohms to about 5 Ohms, a range from about 1 Ohms to about 1.4 Ohms, etc.), and a range that combines two numerals that fall between two of the above-referenced values (i.e., a range from about 1.3 Ohms to about 9.5 Ohms).

Figure 9A:
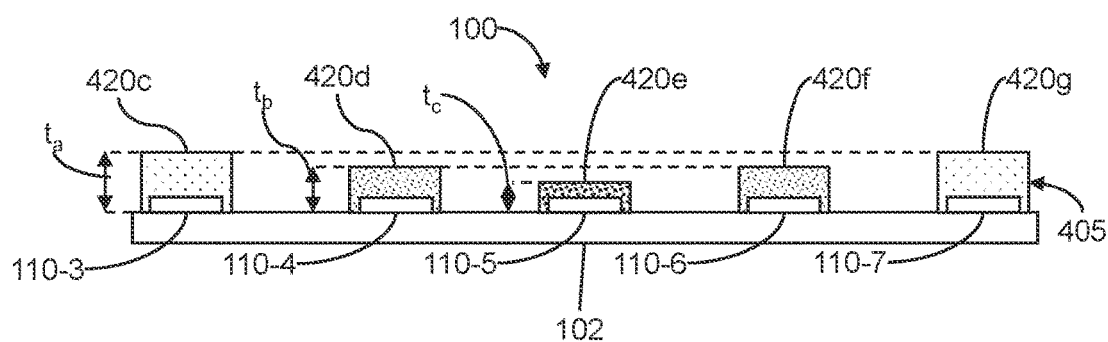
FIG. 9A is a cross-sectional view of the flex circuit, electrode elements, and conductive gel elements taken along the line A-A' in FIG. 9 showing the conductive gel elements in different groups having a different thickness to provide different fixed resistance in accordance with the present disclosure.

Referring now to FIG. 9A, shown therein is a sectional view of flex circuit 102 illustrated in FIG. 9 taken along the line A-A' in the direction of the arrows. In this view, it may be observed that the conductive gel element 420c of the first conductive gel group 422a may have a first thickness $t_a$, the conductive gel element 420d of the second conductive gel group 422b may have a second thickness $t_b$, and the conductive gel element 420e of the third conductive gel group 422c may have a third thickness $t_c$. The first thickness $t_a$, the second thickness $t_b$, and the third thickness $t_c$ may be any thickness that allows the conductive gel elements 420a-t to function in accordance with the present disclosure, as long as the first thickness $t_a$ is greater than the second thickness $t_b$ and the second thickness $t_b$ is greater than the third thickness $t_c$.

While FIG. 9A depicts an embodiment of the present disclosure where the conductive gel elements 420c-g of each of the conductive gel groups 422a-c have one of a first thickness $t_a$, a second thickness $t_b$, or a third thickness $t_c$, the conductive gel elements 420c-g (for example) of other embodiments may include only a first thickness $t_a$ and a second thickness $t_b$, or may include any other number of different thicknesses corresponding to the number of conductive gel groups 422a-z in such embodiments, as long as the first thickness $t_a$ is greater than the second thickness $t_b$, the second thickness $t_b$ is greater than the third thickness $t_c$, and so on.

Having a greater thickness for one or more of the conductive gel elements 420a-t (e.g., made from a uniform material or having a uniform resistance density) provides the one or more of the conductive gel elements 420a-t with a higher resistance. Thus, in certain embodiments, the conductive gel elements 420a-t applied on electrode elements 110-1 to 110-20 possessing fewer neighbor electrode elements and a larger active surface area 404 (e.g., conductive gel elements 420a, 420b, 420c, 420g, 420h, 420m, 420n, 420r, 420s, and 420t) are provided with a greater thickness and/or a higher resistance. In other embodiments, the conductive gel elements 420a-t positioned closer to the outer perimeter 403 and further from the center of mass 402 are provided with a higher resistance. In still other embodiments, the conductive gel elements 420a-t located in electrode areas of lower electrode density are provided with a higher resistance. Any one or all of these feature(s) allows the electrical current supplied by the electrode elements 110-1 to 110-20 to be substantially normalized across the transducer array 100.

Figure 9B:
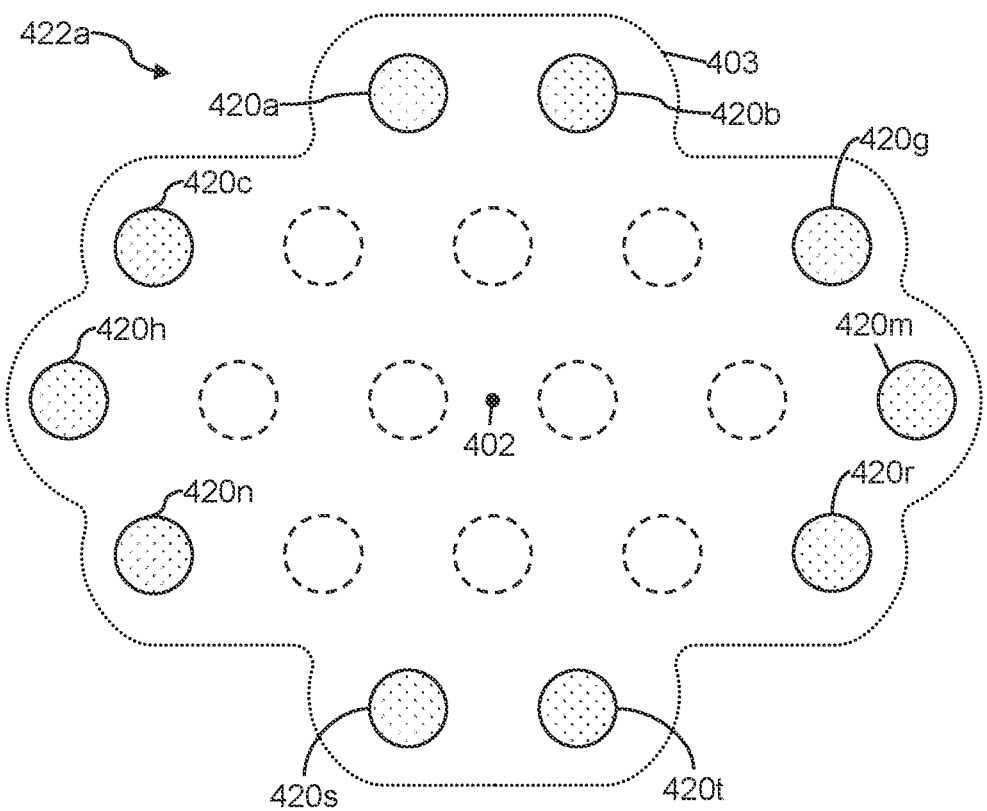
FIG. 9B is a top plan view of a plurality of conductive gel elements in a first conductive gel group.

FIG. 9B is a plan view of the first conductive gel group 422a, according to an embodiment of the present disclosure, as "seen" by the patient's skin. As can be seen in FIG. 9B, the first conductive gel group 422a of this embodiment contains conductive gel elements 420a, 420b, 420c, 420g, 420h, 420m, 420n, 420r, 420s, and 420t.

Figure 9C:
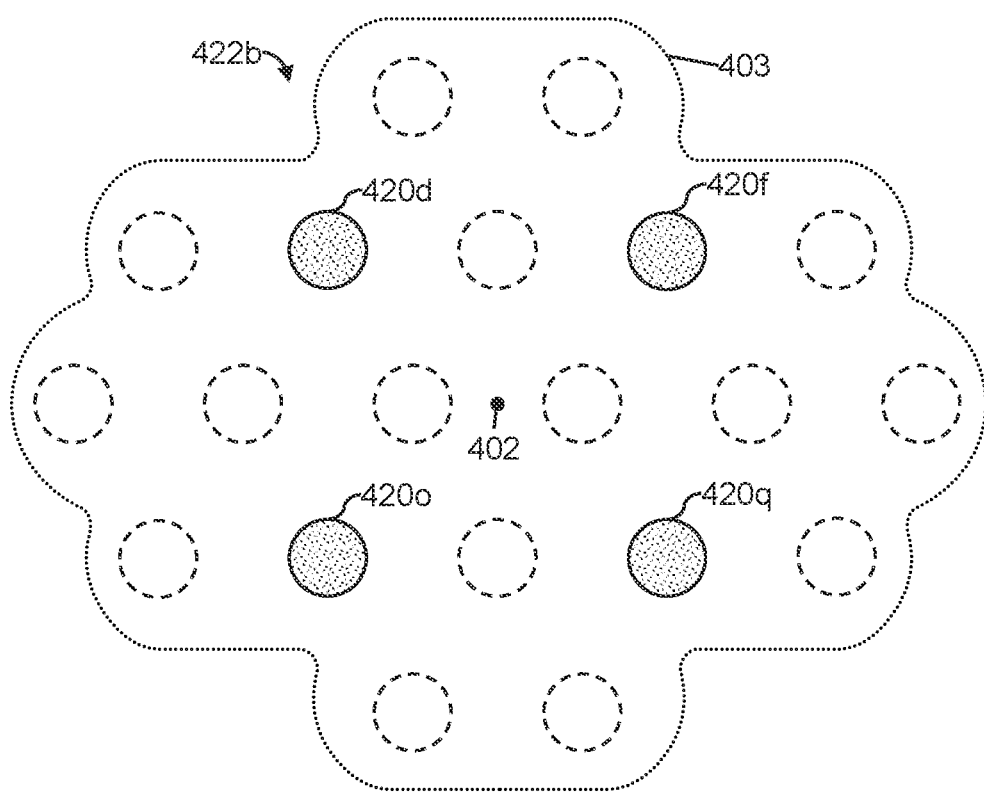
FIG. 9C is a top plan view of a plurality of conductive gel elements in a second conductive gel group.

Shown in FIG. 9C is a plan view of the second conductive gel group 422b, according to an embodiment of the present disclosure, as "seen" by the patient's skin. As can be seen in FIG. 9C, the second conductive gel group 422b of this embodiment contains conductive gel elements 420d, 420f, 4200, and 420q.

Figure 9D:
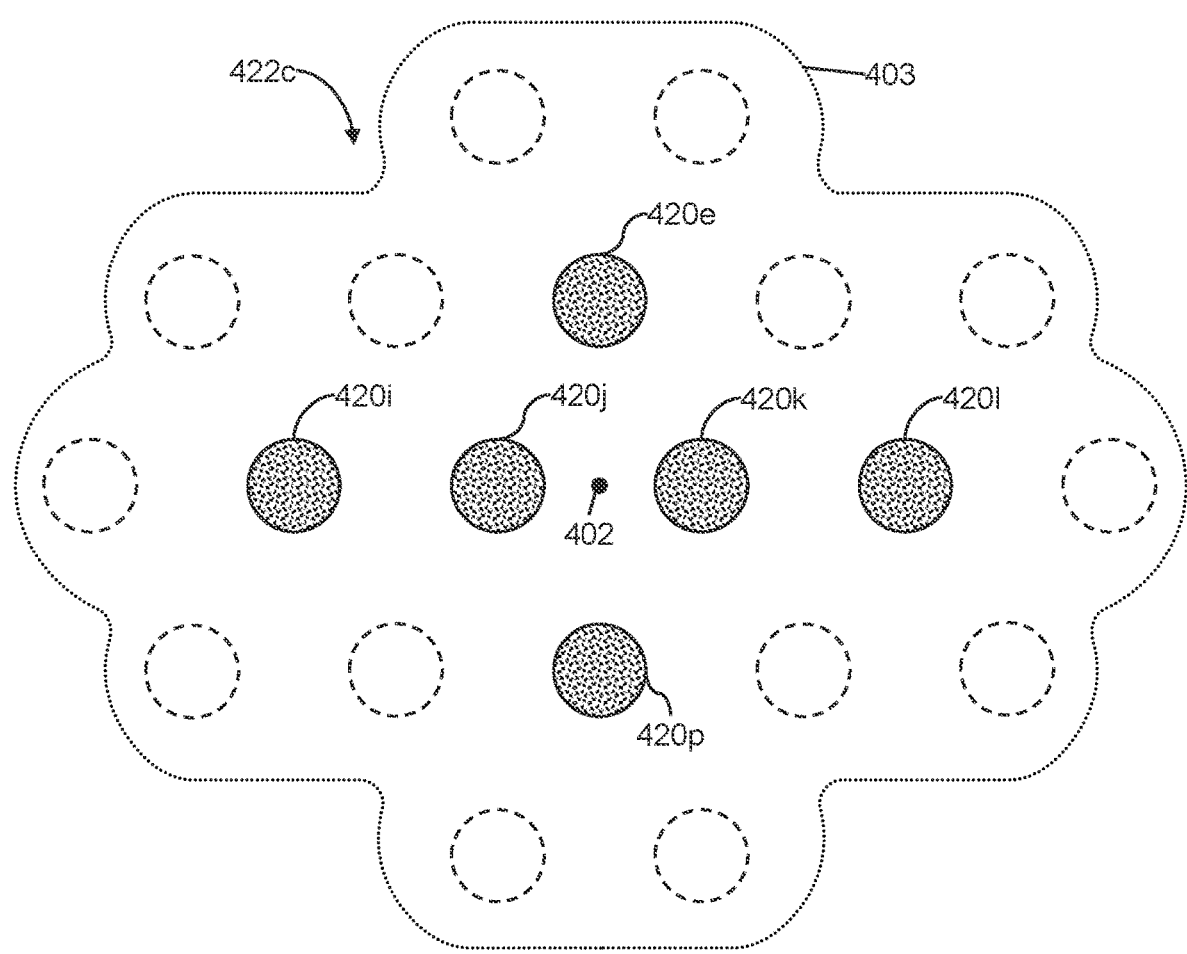
FIG. 9D is a top plan view of a plurality of conductive gel elements in a third conductive gel group.

Shown in FIG. 9D is a plan view of the third conductive gel group 422c, according to an embodiment of the present disclosure, as "seen" by the patient's skin. As can be seen in FIG. 9D, the third conductive gel group 422c of this embodiment contains conductive gel elements 420e, 420i, 420j, 420k, 420l, and 420p.

Figure 10:
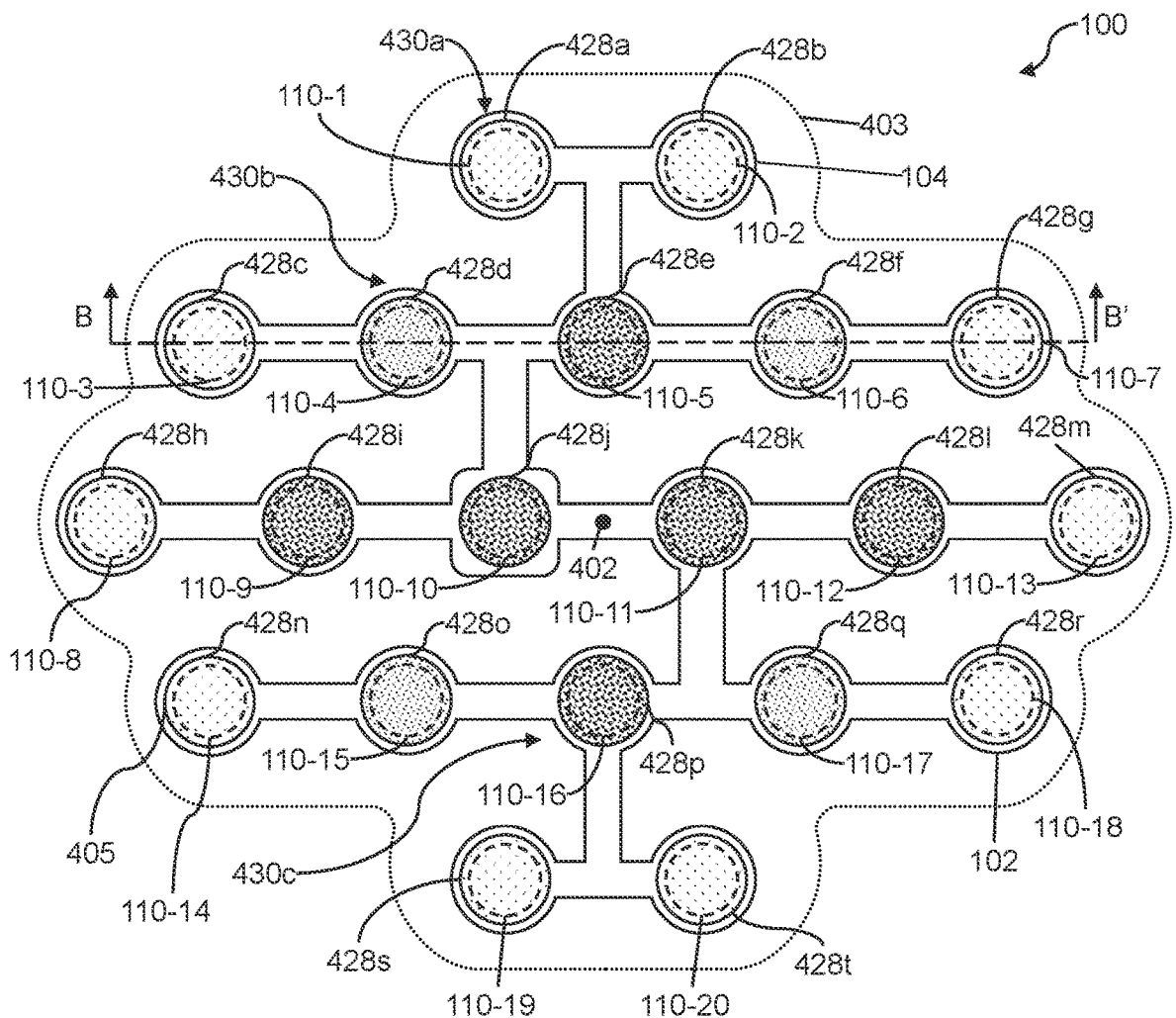
FIG. 10 is a plan view of another embodiment of the flex circuit having the conductive gel elements arranged in a plurality of conductive gel groups with each of the conductive gel elements in the conductive gel groups having a similar thickness.

Referring now to FIG. 10, shown therein is a plan view of another exemplary flex circuit 102, according to an embodiment of the present disclosure, as "seen" by the patient's skin. The flex circuit 102 may have the electrode elements 110 disposed on the inner (i.e., skin-facing) side of the mounting pads 104 of the flex circuit 102. The electrode elements 110 are labeled in FIG. 10 with the reference numerals 110-1 to 110-20 for purposes of clarity. Only one of the mounting pads 104 is labeled for purposes of brevity.

Figure 10A:
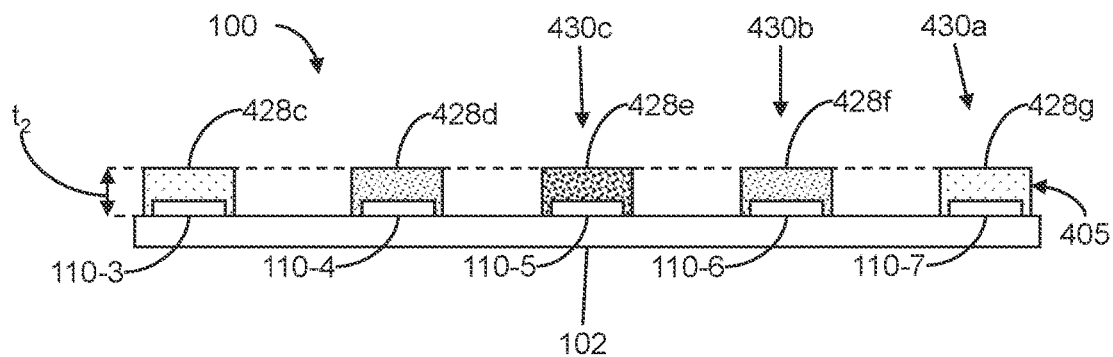
FIG. 10A is a cross-sectional view of the flex circuit, electrode elements, and conductive gel elements taken along the line B-B' in FIG. 10.

In the embodiment shown in FIGS. 10 and 10A, the conductive gel layer 405 is applied to the inner (i.e., skin-facing) side of the electrode elements 110-1 to 110-20. In this embodiment, the regions of the conductive gel layer 405 are implemented as conductive gel elements 428a-t that are distinct and belong to a plurality of conductive gel groups 430a-c, each of the conductive gel groups 430a-c including at least one conductive gel element 428. Only one conductive gel element 428 is labeled with the reference numeral 405 for purposes of brevity.

While FIGS. 10 and 10A depict an embodiment of the present disclosure wherein the plurality of conductive gel groups 430a-c includes a first conductive gel group 430a, a second conductive gel group 430b, and a third conductive gel group 430c, other embodiments may include only two conductive gel groups, or more than three conductive gel groups. In this example, conductive gel elements 428a, 428b, 428c, 428g, 428h, 428m, 428n, 428r, 428s, and 428t are within the first conductive gel group 430a; conductive gel elements 428d, 428f, 428o, and 428q are within the second conductive gel group 430b; and conductive gel elements 428e, 428i, 428j, 428k, 428l, and 428p are within the third conductive gel group 430c.

In the arrangement shown in FIGS. 10 and 10A, each of the conductive gel elements 428 in the first conductive gel group 430a is applied on an electrode element 110 possessing three neighbor electrode elements; each of the conductive gel elements 428 in the second conductive gel group 430b is applied on an electrode element 110 possessing five neighbor electrode elements; and each of the conductive gel elements 428 in the third conductive gel group 430c is applied on an electrode element 110 possessing six neighbor electrode elements. However, it will be understood that the conductive gel elements 428a-t of each of the conductive gel groups 430a-c may be applied on electrode elements 110 possessing any number of neighbor electrode elements, as long as the conductive gel elements 428 in the first conductive gel group 430a are applied on electrode elements 110 possessing fewer neighbor electrode elements than the conductive gel elements 428 in the second conductive gel group 430b, the conductive gel elements 428 in the third conductive gel group 430c are applied on electrode elements 110 possessing fewer neighbor electrode elements than conductive gel elements 428 in the second conductive gel group 430b, if applicable, and so on.

In certain embodiments, the conductive gel elements 428 in the first conductive gel group 430a may be positioned a first distance from the center of mass 402, the conductive gel elements 428 in the second conductive gel group 430b may be positioned a second distance from the center of mass 402, the first distance being greater than the second distance, and the conductive gel elements in the third conductive gel group 430c may be positioned a third distance from the center of mass 402, the second distance being greater than the third distance. In other embodiments, the conductive gel elements 428 in the first conductive gel group 430a may be located in an electrode area having a first electrode density, while the conductive gel elements 428 in the second conductive gel group 430b may be located in an electrode area having a second electrode density greater than the first electrode density, and the conductive gel elements in the third conductive gel group 430c may be located in an electrode area having a third electrode density greater than the second electrode density.

The conductive gel elements 428a-t (FIGS. 10 and 10A) are similar in function to the conductive gel elements 420a-t (FIGS. 9 and 9A). However, in this embodiment, the conductive gel elements 428a-t are not provided with varying thicknesses to alter their resistance. Rather, the conductive gel elements 428a-t of each of the conductive gel groups 430a-c may be constructed of different materials, each of the materials having a unique resistivity; and/or cured under at least one predetermined condition to have a particular resistivity.

The conductive gel elements 428a-t in each conductive gel group 430a-c may have a similar resistivity resulting in a similar resistance, but conductive gel elements 428a-t in different conductive gel groups 430a-c may have a different resistivity resulting in a different resistance. For example, the conductive gel element 428a may have a similar resistivity as the conductive gel element 428b, for example, and may also have a higher resistivity than the conductive gel element 428d, for example. The conductive gel element 428d may have a similar resistivity as the conductive gel element 428f, for example, but may have a higher resistivity than the conductive gel element 428j. The conductive gel elements 428e, 428i, 428j, 428k, 428l, and 428p may have similar resistivities resulting, therefore, in a similar resistance. For example (but not by way of limitation), the similar resistance of the conductive gel elements 428a-t in the first conductive gel group 430a may be about 60 Ohms, while the similar resistance of the conductive gel elements 428a-t in the second conductive gel group 430b may be about 40 Ohms, and the similar resistance of the conductive gel elements 428a-t in the third conductive gel group 430c may be about 20 Ohms.

The conductive gel element 428a of the first conductive gel group 430a may be constructed of a first material having a first resistivity, the conductive gel element 428d of the second conductive gel group 430b may be constructed of a second material having a second resistivity, and the conductive gel element 428j of the third conductive gel group 430c may be constructed of a third material having a third resistivity. The first material, the second material, and the third material may be any material that allows the conductive gel elements 428a-t to function in accordance with the present disclosure, as long as the first resistivity is greater than the second resistivity and the second resistivity is greater than the third resistivity.

While in certain FIG. 10/10A embodiments, the conductive gel elements 428a-t of each of the conductive gel groups 430a-c are constructed of one of a first material, a second material, or a third material, the conductive gel elements 428a-z of other embodiments may be constructed of only a first material and a second material, or may be constructed of any other number of different materials corresponding to the number of conductive gel groups 430a-z in such embodiments, as long as the first resistivity is greater than the second resistivity, the second resistivity is greater than the third resistivity, if applicable, and so on.

In another embodiment, the conductive gel elements 428a-t may be constructed of a same material and have a similar thickness, but still have different amounts of resistivity. Specifically, the resistivity of particular conductive gel elements 428a-t can be configured by curing the conductive gel elements 428a-t from a liquid state to a polymerized state under at least one predetermined condition, such as varying periods of time. In some embodiments, the material forming the conductive gel elements 428a-t may be cured by application of a curing medium, such as ultraviolet light. The intensity or amount of the ultraviolet light supplied onto the material in the liquid state may be configured to cure the material into the conductive gel elements 428a-t having a fixed and known amount of resistivity. In some embodiments, a longer period of time for curing corresponds to a higher resistivity. For instance, the conductive gel elements 428a, 428b, 428c, 428g, 428h, 428m, 428n, 428r, 428s, and 428t in the first conductive gel group 430a may be cured for a first period of time; conductive gel elements 428d, 428f, 428o, and 428q within the second conductive gel group 430b may be cured for a second period of time; and conductive gel elements 428e, 428i, 428j, 428k, 428l, and 428p within the third conductive gel group 430c may be cured for a third period of time. The first period of time, the second period of time, and the third period of time may be any period of time that allows the conductive gel elements 428a-t to function in accordance with the present disclosure, as long as the first period of time is greater than the second period of time and the second period of time is greater than the third period of time.

While in certain FIG. 10 embodiments, the conductive gel elements 428a-t of each of the conductive gel groups 430a-c is cured for one of a first period of time, a second period of time, or a third period of time, the conductive gel elements 428a-z of other embodiments may be cured for only a first period of time and a second period of time, or may be cured for any other number of different periods of time corresponding to the number of conductive gel groups 430a-z in such embodiments, as long as the first period of time is greater than the second period of time, the second period of time is greater than the third period of time, if applicable, and so on.

Thus, in certain embodiments, the conductive gel elements 428a-t applied on electrode elements 110-1 to 110-20 possessing fewer neighbor electrode elements and a larger active surface area 404 (e.g., conductive gel elements 428a, 428b, 428c, 428g, 428h, 428m, 428n, 428r, 428s, and 428t) are provided with a higher resistivity. In other embodiments, the conductive gel elements 428a-t positioned closer to the outer perimeter 403 and further from the center of mass 402 are provided with a higher resistivity. In still other embodiments, the conductive gel elements 428a-t located in electrode areas of lower electrode density are provided with a higher resistivity. Any one or all of these feature(s) allows the electrical current supplied by the electrode elements 110-1 to 110-20 to be substantially normalized across the transducer array 100.

Referring now to FIG. 10A, shown therein is a sectional view of flex circuit 102 illustrated in FIG. 10 taken along the line B-B' in the direction of the arrows. In this view, it may be observed that the conductive gel elements 428c, 428d, 428e, 428f, and 428g may have a similar thickness $t_2$. The thickness $t_2$ may be any thickness that allows the conductive gel elements 428a-t to function in accordance with the present disclosure. Instead, as discussed above, a higher resistivity for 428c and 428g can be obtained by selecting materials such that the resistivity of 428c and 428g are greater than the resistivity of 428d and 428f, which is greater than the resistivity of 428e.

Figure 11:
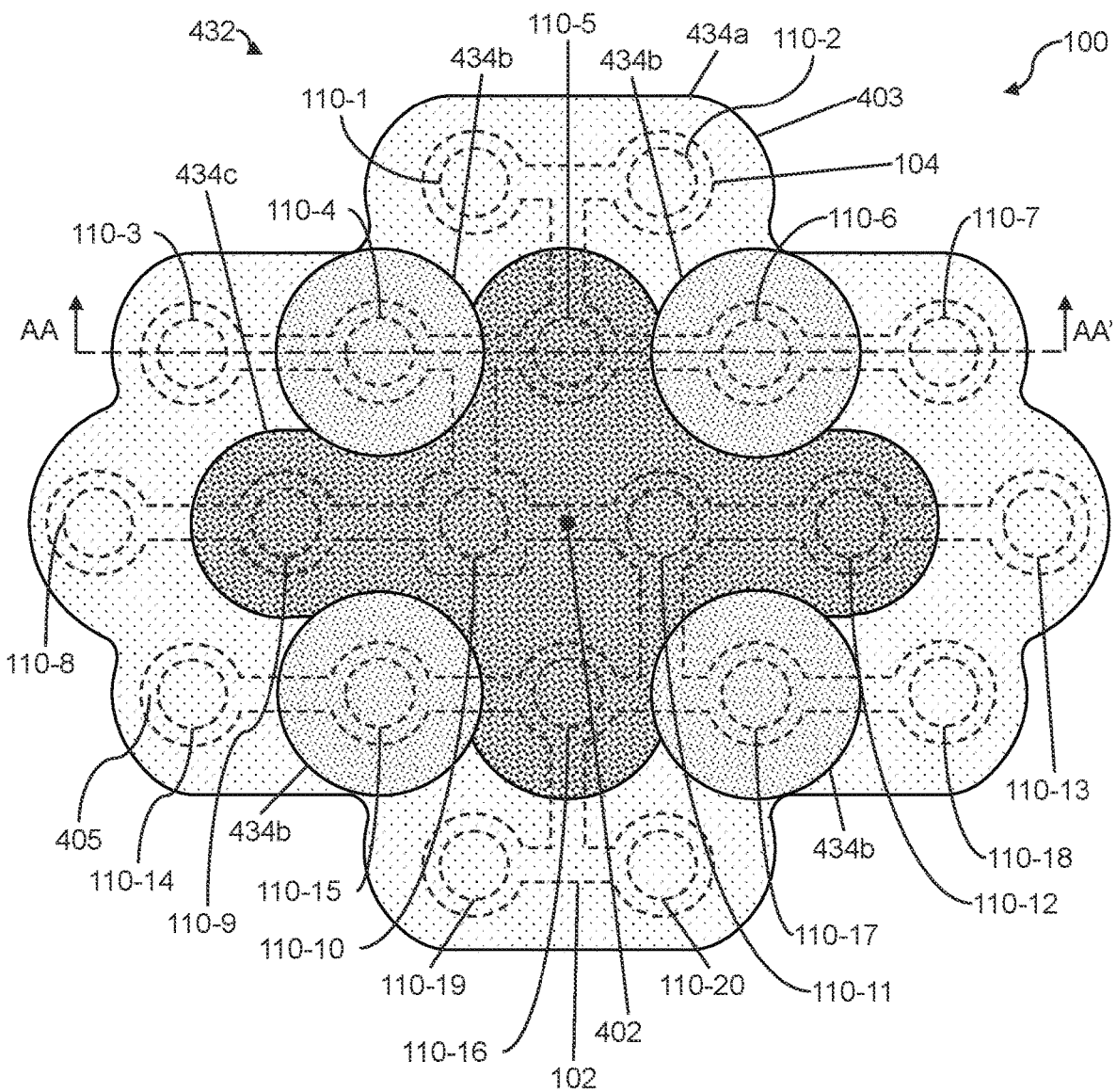
FIG. 11 is a plan view of the flex circuit having a single conductive gel element separated into distinct regions, each of the regions having a different fixed resistance.

Referring now to FIG. 11, shown therein is a plan view of the flex circuit 102 according to another embodiment of the present disclosure as "seen" by the patient's skin. The flex circuit 102 may have the electrode elements 110 disposed on the inner (i.e., skin-facing) side of the mounting pads 104 of the flex circuit 102. The electrode elements 110 are labeled in FIG. 11 with the reference numerals 110-1 to 110-20 for purposes of clarity. Only one of the mounting pads 104 is labeled for purposes of brevity.

Figure 11A:
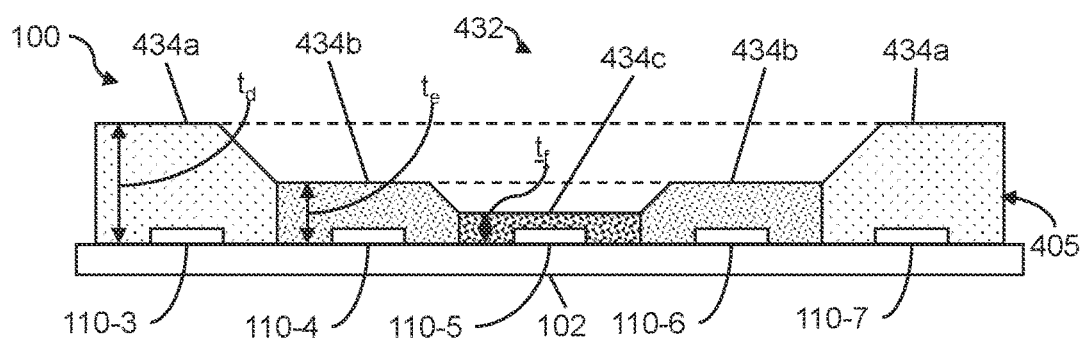
FIG. 11A is a cross-sectional view of the flex circuit, electrode elements, and conductive gel element taken along the line AA-AA' in FIG. 11 showing the different regions of the conductive gel element having a different thickness to provide different fixed resistance in accordance with the present disclosure.

In the embodiment shown in FIGS. 11 and 11A, the conductive gel layer 405 is implemented as a single conductive gel element 432 and is applied to the inner (i.e., skin-facing) side of the flex circuit 102, such that each of the electrode elements 110-1 to 110-20 are at least partially coextensive with the conductive gel element 432. In this embodiment, the regions of the conductive gel layer 405 are implemented as regions 434a-c.

While FIGS. 11 and 11A depict an embodiment of the present disclosure wherein the plurality of regions 434a-c includes a first region 434a, a second region 434b, and a third region 434c, other embodiments may include only two regions, or more than three regions. In this example, electrode elements 110-1, 110-2, 110-3, 110-7, 110-8, 110-13, 110-14, 110-18, 110-19, and 110-20 are at least partially coextensive with the first region 434a; electrode elements 110-4, 110-6, 110-15, and 110-17 are at least partially coextensive with the second region 434b; and electrode elements 110-5, 110-9, 110-10, 110-11, 110-12 and 110-16 are at least partially coextensive with the third region 434c.

In the arrangement shown in FIGS. 11 and 11A, the first region 434a is at least partially coextensive with each of the electrode elements 110 having three neighbor electrode elements; the second region 434b is at least partially coextensive with each of the electrode elements 110 having five neighbor electrode elements; and the third region 434c is at least partially coextensive with each of the electrode elements 110 having six neighbor electrode elements. However, it will be understood that the electrode elements 110 that are at least partially coextensive with each of the regions 434a-c may have any number of neighbor electrode elements, as long as the electrode elements 110 that are at least partially coextensive with the first region 434a have fewer neighbor electrode elements than electrode elements 110 that are at least partially coextensive with the second region 434b, the electrode elements 110 that are at least partially coextensive with the second region 434b have fewer neighbor electrode elements than electrode elements 110 that are at least partially coextensive with the third region 434c, if applicable, and so on.

In certain embodiments, the first region 434a may be positioned a first distance from the center of mass 402, the second region 434b may be positioned a second distance from the center of mass 402, the first distance being greater than the second distance, and the third region 434c may be positioned a third distance from the center of mass 402, the second distance being greater than the third distance. In other embodiments, the first region 434a may be located in an electrode area having a first electrode density, while the second region 434b may be located in an electrode area having a second electrode density greater than the first electrode density, and the third region 434c may be located in an electrode area having a third electrode density greater than the second electrode density.

Each of the regions 434a-c may have a different resistance than the others. For example, the first region 434a may have a higher resistance than the second region 434b, and the second region 434b may have a higher resistance than the third region 434c. For example (but not by way of limitation), the resistance of the first region 434a may be about 60 Ohms, while the resistance of the second region 434b may be about 40 Ohms, and the resistance of the third region 434c may be about 20 Ohms.

Referring now to FIG. 11A, shown therein is a sectional view of the flex circuit 102 illustrated in FIG. 11 taken along the line AA-AA' in the direction of the arrows. In this view, it may be observed that the first region 434a may have a first thickness $t_d$, the second region 434b may have a second thickness $t_e$, and the third region 434c may have a third thickness $t_f$. The first thickness $t_d$, the second thickness $t_e$, and the third thickness $t_f$ may be any thickness that allows the conductive gel element 432 to function in accordance with the present disclosure, as long as the first thickness $t_d$ is greater than the second thickness $t_e$ and the second thickness $t_e$ is greater than the third thickness $t_f$.

While FIG. 11A depicts an embodiment of the present disclosure where the regions 434a-c of the conductive gel element 432 have one of a first thickness $t_d$, a second thickness $t_b$, or a third thickness $t_c$, the regions 434a-z of other embodiments may include only a first thickness $t_d$ and a second thickness $t_e$, or may include any other number of different thicknesses corresponding to the number of regions 434a-z in such embodiments, as long as the first thickness $t_d$ is greater than the second thickness $t_e$, the second thickness $t_e$ is greater than the third thickness $t_f$, if applicable, and so on.

Having a greater thickness (using uniform material, or a uniform resistance density) provides the regions 434a-c with a higher resistance. Thus, in certain embodiments, the regions 434a-c applied on electrode elements 110-1 to 110-20 possessing fewer neighbor electrode elements and a larger active surface area 404 (e.g., the first region 434a) are provided with a higher resistance. In other embodiments, regions 434a-c positioned closer to the outer perimeter 403 and further from the center of mass 402 are provided with a higher resistance. In still other embodiments, the regions 434a-c located in electrode areas of lower electrode density are provided with a higher resistance. Any one or all of these feature(s) allows the electrical current supplied by the electrode elements 110-1 to 110-20 to be substantially normalized across the transducer array 100.

Figure 12:
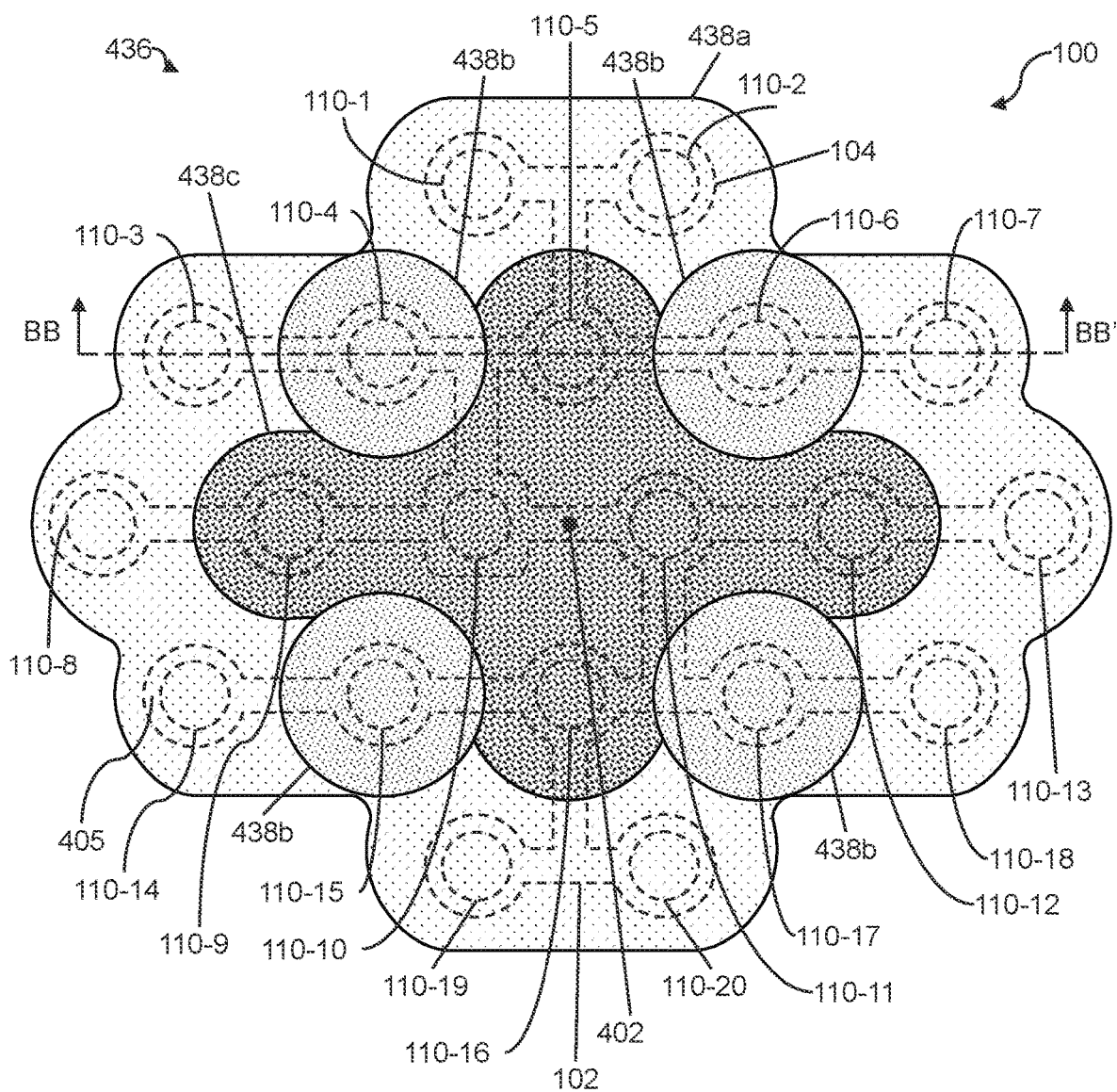
FIG. 12 is a plan view of another embodiment of the flex circuit, electrode elements and conductive gel element having the conductive gel element separated into a plurality of regions with each of the regions of the conductive gel element having a similar thickness.

Referring now to FIG. 12, shown therein is a plan view of the flex circuit 102 according to another embodiment of the present disclosure as "seen" by the patient's skin. The flex circuit 102 may have the electrode elements 110 disposed on the inner (i.e., skin-facing) side of the mounting pads 104 of the flex circuit 102. The electrode elements 110 are labeled in FIG. 12 with the reference numerals 110-1 to 110-20 for purposes of clarity. Only one of the mounting pads 104 is labeled for purposes of brevity.

Figure 12A:
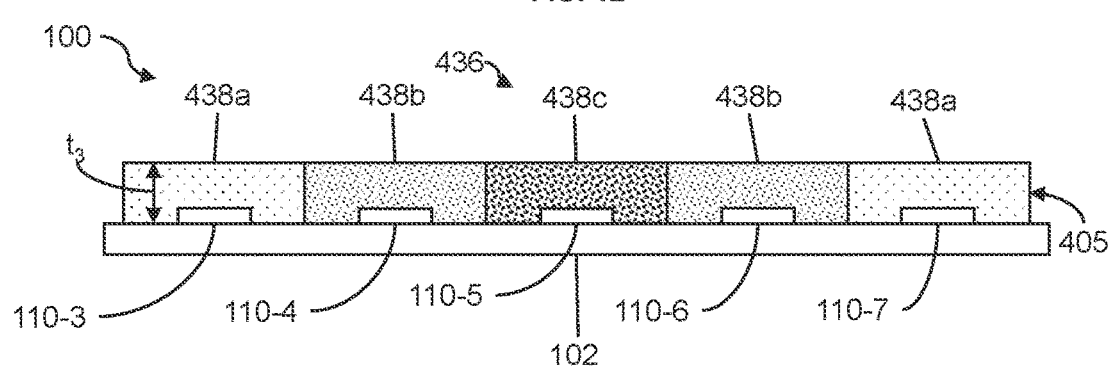
FIG. 12A is a cross-sectional view of the flex circuit, electrode elements, and conductive gel element taken along the line BB-BB' in FIG. 12.

In the embodiment shown in FIGS. 12 and 12A, the conductive gel layer 405 is implemented as a single conductive gel element 436 and is applied to the inner (i.e., skin-facing) side of the flex circuit 102, such that each of the electrode elements 110-1 to 110-20 are at least partially coextensive with the conductive gel element 436. In this embodiment, the regions of the conductive gel layer 405 are implemented as regions 438a-c.

While FIGS. 12 and 12A depict an embodiment of the present disclosure wherein the plurality of regions 438a-c includes a first region 438a, a second region 438b, and a third region 438c, other embodiments may include only two regions, or more than three regions. In this example, electrode elements 110-1, 110-2, 110-3, 110-7, 110-8, 110-13, 110-14, 110-18, 110-19, and 110-20 are at least partially coextensive with the first region 438a; electrode elements 110-4, 110-6, 110-15, and 110-17 are at least partially coextensive with the second region 438b; and electrode elements 110-5, 110-9, 110-10, 110-11, 110-12 and 110-16 are at least partially coextensive with the third region 438c.

In the arrangement shown in FIGS. 12 and 12A, the first region 438a is at least partially coextensive with each of the electrode elements 110 having three neighbor electrode elements; the second region 438b is at least partially coextensive with each of the electrode elements 110 having five neighbor electrode elements; and the third region 438c is at least partially coextensive with each of the electrode elements 110 having six neighbor electrode elements. However, it will be understood that the electrode elements 110 that are at least partially coextensive with each of the regions 438a-c may have any number of neighbor electrode elements, as long as the electrode elements 110 that are at least partially coextensive with the first region 438a have fewer neighbor electrode elements than electrode elements 110 that are at least partially coextensive with the second region 438b, the electrode elements 110 that are at least partially coextensive with the second region 438b have fewer neighbor electrode elements than electrode elements 110 that are at least partially coextensive with the third region 438c, if applicable, and so on.

In certain embodiments, the first region 438a may be positioned a first distance from the center of mass 402, the second region 438b may be positioned a second distance from the center of mass 402, the first distance being greater than the second distance, and the third region 438c may be positioned a third distance from the center of mass 402, the second distance being greater than the third distance. In other embodiments, the first region 438a may be located in an electrode area having a first electrode density, while the second region 438b may be located in an electrode area having a second electrode density greater from the first electrode density, and the third region 438c may be located in an electrode area having a third electrode density greater than the second electrode density.

The regions 438a-c (FIGS. 12 and 12A) are similar in function to the regions 434a-c (FIGS. 11 and 11A). However, in this embodiment, the regions 438a-c are not provided with varying thicknesses to alter their resistance. Rather, the regions 438a-c may be constructed of different materials, each of the materials having a unique resistivity; and/or cured under at least one predetermined condition to have a particular resistivity.

Each of the regions 438a-c may have a different resistivity than the others. For example, the first region 438a may have a higher resistivity than the second region 438b, and the second region 438b may have a higher resistivity than the third region 438c. For example (but not by way of limitation), a resistance of the first region 438a may be about 60 Ohms, while the resistance of the second region 438b may be about 40 Ohms, and the resistance of the third region 438c may be about 20 Ohms.

The first region 438a may be constructed of a first material having a first resistivity, the second region 438b may be constructed of a second material having a second resistivity, and the third region 438c may be constructed of a third material having a third resistivity. The first material, the second material, and the third material may be any material that allows the conductive gel element 436 to function in accordance with the present disclosure, as long as the first resistivity is greater than the second resistivity and the second resistivity is greater than the third resistivity.

While in certain FIG. 12/12A embodiments, the regions 438a-c of the conductive gel element 436 are constructed of one of a first material, a second material, or a third material, the regions 438a-z of other embodiments may be constructed of only a first material and a second material, or may be constructed of any other number of different materials corresponding to the number of regions 438a-z in such embodiments, as long as the first resistivity is greater than the second resistivity, the second resistivity is greater than the second third resistivity, if applicable, and so on.

In another embodiment, the regions 438a-c may be constructed of a same material and have a similar thickness, but still have different amounts of resistivity. Specifically, the resistivity of the regions 438a-c may be configured by curing the regions 438a-c from a liquid state to a polymerized state under at least one predetermined condition, such as varying periods of time. In some embodiments, the material forming the conductive gel element 436 may be cured by application of a curing medium, such as ultraviolet light. The intensity or amount of the ultraviolet light supplied onto the material in the liquid state may be configured to cure the material into the regions 438a-c having a fixed and known amount of resistivity. In some embodiments, a longer period of time for curing corresponds to a higher resistivity. For instance, the first region 438a may be cured for a first period of time; the second region 438b may be cured for a second period of time; and the third region 438c may be cured for a third period of time. The first period of time, the second period of time, and the third period of time may be any period of time that allows the conductive gel element 436 to function in accordance with the present disclosure, as long as the first period of time is greater than the second period of time and the second period of time is greater than the third period of time.

While in certain FIG. 12/12A embodiments, the regions 438a-c of the conductive gel element 436 are cured for one of a first period of time, a second period of time, or a third period of time, the regions 438a-z of other embodiments may be cured for only a first period of time and a second period of time, or may be cured for any other number of different periods of time corresponding to the number of regions 438a-z in such embodiments, as long as the first period of time is greater than the second period of time, the second period of time is greater than the third period of time, if applicable, and so on.

Thus, in certain embodiments, the regions 438a-c applied on electrode elements 110-1 to 110-20 possessing fewer neighbor electrode elements and a larger active surface area 404 (e.g., the first region 438a) are provided with a higher resistivity. In other embodiments, regions 438a-c positioned closer to the outer perimeter 403 and further from the center of mass 402 are provided with a higher resistivity. In still other embodiments, the regions 438a-c located in electrode areas of lower electrode density are provided with a higher resistivity. Any one or all of these feature(s) allows the electrical current supplied by the electrode elements 110-1 to 110-20 to be substantially normalized across the transducer array 100.

Referring now to FIG. 12A, shown therein is a sectional view of flex circuit 102 illustrated in FIG. 12 taken along the line BB-BB' in the direction of the arrows. In this view, it may be observed that the regions 438a-c may have a similar thickness $t_3$. The thickness $t_3$ may be any thickness that allows the conductive gel element 436 to function in accordance with the present disclosure.

Disclosed herein are three ways to configure the conductive gel layer 405 with a particular fixed resistance: configuring the thickness; configuring the materials; and configuring at least one condition for curing the materials from a liquid state to a polymerized state. In the present disclosure, each of the regions of the conductive gel layer 405 has a predefined resistance. Any of the methodologies described herein for configuring the conductive gel layer 405 can be used, and transducer arrays 100 can be formed using a combination of the methodologies. For example, certain of the regions may be constructed of different materials with each material having a different resistivity, and certain of the regions may be cured under predefined conditions to set the resistivity.

To make the transducer array 100, a flex circuit 102 having a branching or ramified configuration may be made with electrical traces extending along the branches of the flex circuit 102. The flex circuit 102 may be made with an inner skin-facing side and an outer side, a central trunk 108a-108g that extends in a longitudinal direction, and a plurality of branches that extend laterally from both sides of the trunk 108a-g of the flex circuit 102. These branches may be perpendicular to the longitudinal direction and may be arranged as rows, for example, 106a-106e of the flex circuit 102. Each of the rows (106a-106e) of the flex circuit 102 may include two branches—one on either side of the trunks 108a-108g. The proximal end of each branch may be connected to and extend from the trunk 108a-g of the flex circuit 102, while the distal end of each branch remains free. The flex circuit 102 may include a number of mounting pads 104 arranged along the rows (106a-106e) of the flex circuit 102, the mounting pads 104 being spatially disposed in a grid format.

A plurality of electrode elements 110 may be applied on an inner (i.e., skin-facing) side of the mounting pads 104, each of the plurality of electrode elements 110 being disposed on a corresponding mounting pad 104 with an electrically conductive connection between the plurality of electrode elements and the flex circuit 102. The electrode elements 110 may be configured to receive an electrical signal from a generator 416 (FIG. 8) producing an electrical signal as a Tumor Treating Field.

One or more temperature sensors 410 may be positioned adjacent to and/or beneath respective electrode elements 110 such that the one or more temperature sensors 410 are configured to obtain one or more temperature readings of the electrode elements 110 (FIG. 8). A corresponding number of stiffeners 112 may optionally be attached to the outer side of the mounting pads 104 of the flex circuit 102 generally opposite the electrode elements 110 attached to the inner side.

In certain embodiments, a first conductive gel element 420a (FIG. 9) or 428a (FIG. 10) may be applied on a first electrode element 110-1 of the plurality of electrode elements 110, the first conductive gel element 420a or 428a having a first resistivity. The first electrode element 110-1 may be within a first electrode area having a first electrode density, may be located a first distance from the center of mass 402, and/or may possess a first number of neighbor electrode elements. A second conductive gel element 420d or 428d may be applied on a second electrode element 110-4 of the plurality of electrode elements 110, the second conductive gel element 420d or 428d having a second resistivity different from the first resistivity. The second electrode element 110-4 may be within a second electrode area having a second electrode density different from the first electrode density, may be located a second distance from the center of mass 402 different from the first distance, and/or may possess a second number of neighbor electrode elements different from the first number. The conductive gel elements 420a-t or 428a-t may be at least one of electrically coupled and capacitively coupled to the electrode elements 110-1 to 110-20. As discussed above, the first conductive gel element 420a or 428a and the second conductive gel element 420d or 428d may have different thicknesses, may be constructed of different materials, or may be cured for different periods of time. In certain embodiments, the first electrode density is higher than the second electrode density, and/or a first resistance of the first conductive gel element 420a or 428a, based on the first resistivity, is lower than a second resistance of the second conductive gel element 420d or 428d based on the second resistivity.

Applying the first conductive gel element 420a or 428a on the first electrode element 110-1 of the plurality of electrode elements 110 is defined further as applying liquid conductive gel on the first electrode element 110-1 of the plurality of electrode elements 110 and curing the liquid conductive gel into a polymerized state using a first set of conditions to form the first conductive gel element 420a or 428a having the first resistivity. In another embodiment, the first conductive gel element 420a or 428a, for example, may be formed by applying liquid conductive gel onto a substrate such as, but not limited to, the first electrode element 110-1, and then curing the liquid conductive gel into a polymerized state using a first set of conditions to form the first conductive gel element 420*a* or 428*a* having the first resistivity. When the substrate is not the first electrode element 110-1, for example, the polymerized conductive gel element 420*a* or 428*a* may be transferred from the substrate and positioned on the first electrode element 110-1. The second conductive gel element 420*d* or 428*d*, for example, may be formed by applying liquid conductive gel onto the substrate, and then curing the liquid conductive gel into a polymerized state using a second set of conditions to form the second conductive gel element 420*d* or 428*d* having the second resistivity. The first set of conditions may include a first period of time, and the second set of conditions may include a second period of time different from the first period of time. These processes are then repeated to apply the remaining conductive gel elements 420*a-t* or 428*a-t* to the electrode elements 110-1 to 110-20 until desirably all the electrode elements 110-1 to 110-20 support a particular one of the conductive gel elements 420*a-t* or 428*a-t* having a desired resistivity, the conductive gel elements 420*a-t* or 428*a-t* forming a plurality of conductive gel groups 422*a-c* (FIG. 9) or 430*a-c* (FIG. 10).

In other embodiments, a first region 434*a* (FIG. 11) or 438*a* (FIG. 12) of the conductive gel element 432 or 436 may be applied on a first electrode area, the first region 434*a* or 438*a* having a first resistivity or first resistance. The first electrode area may have a first electrode density, may be located a first distance from the center of mass 402, and/or may possess a first number of neighbor electrode elements. A second region 434*b* or 438*b* of the conductive gel element 432 or 436 may be applied on a second electrode area, the second region 434*b* or 438*b* having a second resistivity or second resistance different from the first resistivity or first resistance. The second electrode area may have a second electrode density different from the first electrode density, may be located a second distance from the center of mass 402 different from the first distance, and/or may possess a second number of neighbor electrode elements different from the first number. The regions 434*a-c* or 438*a-c* may be at least one of electrically coupled and capacitively coupled to the electrode elements 110-1 to 110-20. As discussed above, the first region 434*a* or 438*a* and the second region 434*b* or 438*b* may have different thicknesses, may be constructed of different materials, or may be cured for different periods of time. In certain embodiments, the first electrode density is lower than the second electrode density, and/or the first resistivity is higher than the second resistivity, and/or the first resistance is higher than the second resistance.

Applying the first region 434*a* or 438*a* of the conductive gel element 432 or 436 on the first area having the first resistivity is defined further as applying liquid conductive gel on the first area and curing the liquid conductive gel into a polymerized state using a first set of conditions to form the first region 434*a* or 438*a* having the first resistivity. In another embodiment, the first region 434*a* or 438*a*, for example, may be formed by applying liquid conductive gel onto a substrate such as, but not limited to, the first area, and then curing the liquid conductive gel into a polymerized state using a first set of conditions to form the first region 434*a* or 438*a* having the first resistivity. When the substrate is not the first area, for example, the polymerized first region 434*a* or 438*a* of the conductive gel element 432 or 436 may be transferred from the substrate and positioned on the first area. The second region 434*b* or 438*b* of the conductive gel element 432 or 436, for example, may be formed by applying liquid conductive gel onto the substrate, and then curing the liquid conductive gel into a polymerized state using a second set of conditions to form the second region 434*b* or 438*b* having the second resistivity. The first set of conditions may include a first period of time, and the second set of conditions may include a second period of time different from the first period of time. These processes are then repeated to apply the remaining regions 434*a-c* or 438*a-c* of the conductive gel element 432 or 436 to the electrode elements 110-1 to 110-20 until desirably all of the electrode elements 110-1 to 110-20 are at least partially coextensive with a particular one of the regions 434*a-c* or 438*a-c* having a desired resistivity.

A first end of the electrical cable 134 may be connected to an outer side of the flex circuit 102, while a second end of the electrical cable 134 may be connected to a control box 414 or fitted with a connector 412 so as to be connectable to the control box 414 (FIG. 8). Optionally, a module 407 having a distal circuit 408 mounted therein may be mounted between the electrical cable 134 and the flex circuit 102, the module 407 being communicatively coupled with the flex circuit 102 via a connector 412. A conductor 418 may be provided to connect a generator 416 to the flex circuit 102, or the generator 416 may be connected to the flex circuit 102 via the control box 414. The generator 416 may be configured to provide the flex circuit 102 with an electrical signal as a Tumor Treating Field.

As in other described embodiments, a top, covering adhesive-backed layer 126 may be positioned above and connected to an outer side of the flex circuit 102 (FIG. 3A). The covering adhesive-backed layer 126 may have a number of slots 128, which divide the covering adhesive-backed layer 126 into a number of separate fingers 130, each of which overlies a respective branch of the flex circuit 102. In some embodiments, the covering adhesive-backed layer 126 includes a central aperture 135 and a slit 132. The central aperture 135 permits the electrical cable 134 that protrudes from the back surface of the flex circuit 102 to extend through the covering adhesive-backed layer 126. The slit 132 is useful for positioning the covering adhesive-backed layer 126 over the flex circuit 102 after the electrical cable 134 has been connected to the flex circuit 102.

A two-part release liner 140 may be applied over the conductive gel element 432 or 436 or the conductive gel elements 420*a-t* or 428*a-t* to an inner (i.e., skin-facing) side of the flex circuit 102, the two-part release liner 140 being configured to protect the transducer array 100 prior to use on a patient. The release liner 140 has an overall shape that generally follows, but may be slightly larger than, the outer periphery of the covering adhesive-backed layer 126.

The following is a number list of non-limiting illustrative embodiments of the inventive concept disclosed herein:

1. A method of making a transducer array, comprising:
   applying a conductive gel layer to a conductive layer having one or more electrode element, the conductive gel layer having a first region and a second region, the first region having a first resistivity, and the second region having a second resistivity different from the first resistivity.
2. The method of illustrative embodiment 1, wherein the first region is within a first area having a first electrode density, and the second region is within a second area having a second electrode density, the first electrode density different from the second electrode density.

3. The method of illustrative embodiment 2, wherein the first electrode density is higher than the second electrode density, and wherein the first resistivity is lower than the second resistivity.

4. The method of illustrative embodiment 1, wherein the one or more electrode element includes a first electrode element at least partially coextensive with the first region, and a second electrode element at least partially coextensive with the second region, the first electrode element and the second electrode element being spatially disposed within an electrode area having an outer perimeter, and wherein the second electrode element is closer to the outer perimeter than the first electrode element.

5. The method of illustrative embodiment 1, wherein the conductive layer has a center of mass, and wherein the first region is spaced from the center of mass a first distance, and the second region is spaced from the center of mass a second distance, and wherein the second resistivity is greater than the first resistivity.

6. The method of illustrative embodiment 5, wherein the resistivity of the conductive gel layer increases as a distance from the center of mass increases.

7. The method of illustrative embodiment 6, wherein the resistivity of the conductive gel layer varies in a step-wise manner.

8. The method of illustrative embodiment 6, wherein the resistivity of the conductive gel layer varies in a continuous manner.

9. the method of illustrative embodiment 6, wherein the resistivity of particular regions of the conductive gel layer varies proportionately to the distance of the particular regions from the center of mass.

10. The method of illustrative embodiment 9, wherein the resistivity of the conductive gel layer varies in a step-wise manner.

11. The method of illustrative embodiment 9, wherein the resistivity of the conductive gel layer varies in a continuous manner.

12. The method of illustrative embodiment 1 further comprising the step of forming the first region of the conductive gel layer with a first thickness and forming the second region of the conductive gel layer with a second thickness, and wherein the first thickness is different from the second thickness.

13. The method of illustrative embodiment 1 further comprising the step of forming the first region of the conductive gel layer with a first material and forming the second region of the conductive gel layer with a second material, the first material being different from the second material.

14. The method of illustrative embodiment 13, wherein both the first material and the second material comprise a same component A, but one of the first material and the second material further comprises one or more component not present in the other material.

15. The method of illustrative embodiment 14, wherein the resistivity of the conductive gel layer varies in a step-wise manner.

16. The method of illustrative embodiment 1, further comprising the step of forming the first region of the conductive gel layer by applying a first liquid conductive gel onto a first substrate and curing the first liquid conductive gel into a polymerized state using a first set of conditions to provide the first region with the first resistivity, and forming the second region of the conductive gel layer by applying a second liquid conductive gel onto a second substrate and curing the second liquid conductive gel into the polymerized state using a second set of conditions to provide the second region with the second resistivity.

17. A method of making a transducer array, comprising:
applying a first conductive gel element on a first electrode element of a plurality of electrode elements, the first conductive gel element having a first resistivity;
applying a second conductive gel element on a second electrode element of the plurality of electrode elements, the second conductive gel element having a second resistivity different from the first resistivity.

18. The method of illustrative embodiment 17, wherein applying the first conductive gel element on the first electrode element of the plurality of electrode elements is defined further as applying the first conductive gel element having a first thickness on the first electrode element, and wherein applying the second conductive gel element on the second electrode element of the plurality of electrode elements is defined further as applying the second conductive gel element having a second thickness on the second electrode element, wherein the second thickness is different from the first thickness.

19. The method of illustrative embodiment 17, wherein applying the first conductive gel element on the first electrode element of the plurality of electrode elements includes applying a plurality of first conductive gel elements on a plurality of first electrode elements of the plurality of electrode elements to form a first conductive gel group.

20. The method of illustrative embodiment 19, wherein applying the second conductive gel element on the second electrode element of the plurality of electrode elements includes applying a plurality of second conductive gel elements on a plurality of second electrode elements of the plurality of electrode elements to form a second conductive gel group.

21. The method of illustrative embodiment 20, wherein the first electrode elements are within first areas having a first electrode density, and the second electrode elements are within second areas having a second electrode density, and wherein the first electrode density is different from the second electrode density.

22. The method of illustrative embodiment 21, wherein the first electrode density is determined by counting a number of neighbor electrode elements adjacent to the first electrode elements, and the second electrode density is determined by counting a number of neighbor electrode elements adjacent to the second electrode elements.

23. The method of illustrative embodiment 17, further comprising the step of forming the first conductive gel element of a first material and forming the second conductive gel element of a second material, the second material being different from the first material.

24. The method of illustrative embodiment 23, wherein both the first material and the second material comprise a same component A, but one of the first material and the second material further comprises one or more component not present in the other material.

25. The method of illustrative embodiment 17, wherein applying the first conductive gel element on the first electrode element of the plurality of electrode elements is defined further as applying liquid conductive gel on the first electrode element of the plurality of electrode elements and curing the liquid conductive gel into a polymerized state using a first set of conditions to form the first conductive gel element having the first resistivity.

26. The method of illustrative embodiment 17, wherein applying the second conductive gel element on the second electrode element of the plurality of electrode elements is defined further as applying liquid conductive gel on the second electrode element of the plurality of electrode elements and curing the liquid conductive gel into a polymerized state using a second set of conditions to form the second conductive gel element having the second resistivity.

27. The method of illustrative embodiment 17, further comprising the step of forming the first conductive gel element by applying liquid conductive gel on a substrate and then curing the liquid conductive gel into a polymerized state using a first set of conditions to form the first conductive gel element having the first resistivity.

28. The method of illustrative embodiment 27, further comprising forming the second conductive gel element by applying liquid conductive gel on the substrate and then curing the liquid conductive gel into a polymerized state using a second set of conditions to form the second conductive gel element having the second resistivity.

29. The method of illustrative embodiment 28, wherein the first set of conditions includes a first period of time and the second set of conditions includes a second period of time.

30. A method of making a transducer array, comprising:
providing an electrode layer having a plurality of spatially disposed electrode elements configured to receive an electrical signal from an electric field generator producing an electric signal as a Tumor Treating Field, the electrode elements being electrically isolated, each of the electrode elements having at least one neighbor electrode element and being subject to an electrode density;
applying a conductive gel layer on electrode elements with regions of the conductive gel layer electrically or capacitively coupled with particular electrode elements such that the resistivity of particular regions is based on the electrode density.

31. The method of illustrative embodiment 30, wherein applying the conductive gel layer is defined further as applying a first region of the conductive gel layer on a first electrode element of the electrode elements having a first electrode density, and applying a second region of the conductive gel layer on a second electrode element of the electrode elements having a second electrode density, the first region having a first resistivity and the second region having a second resistivity, and wherein the first resistivity is different from the second resistivity.

32. The method of illustrative embodiment 30, wherein applying the conductive gel layer is defined further as applying a first region of the regions of the conductive gel layer on a first electrode element of the electrode elements, and applying a second region of the regions of the conductive gel layer on a second electrode element of the electrode elements, the first region having a first thickness and the second region having a second thickness, and wherein the first thickness is different from the second thickness.

33. The method of illustrative embodiment 30, wherein providing the electrode layer is defined further as providing the electrode layer having the plurality of spatially disposed electrode elements extending within an electrode area having an outer perimeter, and wherein applying the conductive gel layer is defined further as applying the conductive gel layer with a greater thickness on electrode elements that are closer to the outer perimeter relative to electrode elements that are farther away from the outer perimeter.

34. The method of illustrative embodiment 30, wherein applying the conductive gel layer is defined further as applying the conductive gel layer such that a first region of the regions is made of a first material, and a second region of the regions is made of a second material, the second material being different from the first material.

35. The method of illustrative embodiment 34, wherein both the first material and the second material comprise a same component A, but one of the first material and the second material further comprises one or more component not present in the other material.

36. The method of illustrative embodiment 30, wherein applying the conductive gel layer is defined further as applying the conductive gel layer such that a first region of the regions is cured under a first set of conditions, and a second region of the regions is cured under a second set of conditions.

37. The method of illustrative embodiment 30, wherein the electrode density for each electrode element depends upon at least one of a number of neighbor electrode elements and a spacing from each electrode element to the neighbor electrode elements.

38. A transducer array, comprising:
a conductive layer having one or more electrode element, the one or more electrode element configured to receive electrical signals from an electric field generator producing an electric signal as a Tumor Treating Field;
a conductive gel layer overlapping the one or more electrode element of the conductive layer, the conductive gel layer having a first region and a second region, the first region having a first resistivity and the second region having a second resistivity, the first resistivity being different from the second resistivity.

39. The transducer array of illustrative embodiment 38, wherein the first region has a first thickness and the second region has a second thickness, the second thickness being different from the first thickness.

40. The transducer array of illustrative embodiment 38 wherein the one or more electrode element includes a first electrode element, and wherein the first region and the second region are at least one of electrically coupled and capacitively coupled to the first electrode element.

41. The transducer array of illustrative embodiment 40, wherein the conductive gel layer extends outwardly from the first electrode element.

42. The transducer array of illustrative embodiment 41, wherein the first region of the conductive gel layer does not overlap with the first electrode element, and the second region of the conductive gel layer overlaps with the first electrode element, and wherein the first resistivity is less than the second resistivity.

43. The transducer array of illustrative embodiment 38, wherein the first region is within a first area having a first electrode density, and the second region is within a second area having a second electrode density, the first electrode density different from the second electrode density.

44. The transducer array of illustrative embodiment 43, wherein the first electrode density is higher than the second electrode density, and wherein the first resistivity is lower than the second resistivity.

45. The transducer array of illustrative embodiment 38, wherein the one or more electrode element includes a first electrode element at least partially coextensive with the first region, and a second electrode element at least partially coextensive with the second region, the first electrode element and the second electrode element being spatially disposed within an electrode area having an outer perimeter, and wherein the first electrode element is closer to the outer perimeter than the second electrode element, and the first resistivity is greater than the second resistivity.

46. The transducer array of illustrative embodiment 38, wherein the first region of the conductive gel layer is a first material, and the second region of the conductive gel layer is a second material, the first material being different from the second material.

47. The transducer array of illustrative embodiment 46, wherein both the first material and the second material comprise a same component A, but one of the first material and the second material further comprises one or more component not present in the other material.

48. The transducer array of illustrative embodiment 38, wherein the conductive layer has a center of mass, and wherein the first region is spaced from the center of mass a first distance, and the second region is spaced from the center of mass a second distance, and wherein the second resistivity is greater than the first resistivity.

49. The transducer array of illustrative embodiment 48, wherein the resistivity of the conductive gel layer varies based on distance from the center of mass.

50. The transducer array of illustrative embodiment 49, wherein the resistivity of the conductive gel layer varies in a step-wise manner.

51. The transducer array of illustrative embodiment 49, wherein the resistivity of the conductive gel layer varies in a continuous manner.

52. The transducer array of illustrative embodiment 49, wherein the resistivity of the conductive gel layer increases proportionately to the distance from the center of mass.

53. The method of illustrative embodiment 52, wherein the resistivity of the conductive gel layer varies in a step-wise manner.

54. The method of illustrative embodiment 52, wherein the resistivity of the conductive gel layer varies in a continuous manner.

55. A method of making a transducer array, comprising:
applying a conductive gel layer to a conductive layer having one or more electrode element, the conductive gel layer having a first region and a second region, the first region having a first resistance, and the second region having a second resistance different from the first resistance.

56. The method of illustrative embodiment 55 further comprising the step of forming the first region of the conductive gel layer with a first thickness and forming the second region of the conductive gel layer with a second thickness, and wherein the first thickness is different from the second thickness.

57. The method of illustrative embodiment 55, further comprising the step of forming the first region of the conductive gel layer with a first material having a first resistivity and forming the second region of the conductive gel layer with a second material having a second resistivity, the first material being different from the second material.

58. A method of making a transducer array, comprising:
applying a first conductive gel element on a first electrode element of a plurality of electrode elements, the first conductive gel element having a first resistance;
applying a second conductive gel element on a second electrode element of the plurality of electrode elements, the second conductive gel element having a second resistance different from the first resistance.

59. The method of illustrative embodiment 58, wherein applying the first conductive gel element on the first electrode element of the plurality of electrode elements is defined further as applying the first conductive gel element having a first thickness and the first resistance on the first electrode element, and wherein applying the second conductive gel element on the second electrode element of the plurality of electrode elements is defined further as applying the second conductive gel element having a second thickness and the second resistance on the second electrode element, wherein the second thickness is different from the first thickness.

60. The method of illustrative embodiment 58, further comprising the step of forming the first conductive gel element of a first material having a first resistivity and forming the second conductive gel element of a second material having a second resistivity, the second material being different from the first material.

61. A transducer array, comprising:
a conductive layer having one or more electrode element, the one or more electrode element configured to receive electrical signals from an electric field generator producing an electric signal as a Tumor Treating Field; and
a conductive gel layer overlapping the one or more electrode element of the conductive layer, the conductive gel layer having a first region and a second region, the first region having a first resistance and the second region having a second resistance, the first resistance being different from the second resistance.

62. The transducer array of illustrative embodiment 61, wherein the first region has a first thickness and the first resistance and the second region has a second thickness and the second resistance, the second thickness being different from the first thickness.

63. The transducer array of illustrative embodiment 61, wherein the first region comprises a first material having a first resistivity and the second region comprises a second material having a second resistivity, the first material being different from the second material.

Embodiments illustrated under any heading or in any portion of the disclosure may be combined with embodiments illustrated under the same or any other heading or other portion of the disclosure unless otherwise indicated herein or otherwise clearly contradicted by context.

From the above description, it is clear that the inventive concepts disclosed and claimed herein are well adapted to carry out the objects and to attain the advantages mentioned herein, as well as those inherent in the invention. While exemplary embodiments of the inventive concepts have been described for purposes of this disclosure, it will be understood that numerous changes may be made which will readily suggest themselves to those skilled in the art and which are accomplished within the spirit of the inventive concepts disclosed and claimed herein.

What is claimed is:
1. A transducer array, comprising:
a conductive layer having one or more electrode element, the one or more electrode element configured to receive electrical signals from an electric field generator producing an electric signal as a Tumor Treating Field; and
a conductive gel layer overlapping the one or more electrode element of the conductive layer, the conductive gel layer having a first region and a second region, the first region having a first thickness and a first resistance and the second region having a second thickness and a second resistance, the first thickness being different from the second thickness.

2. The transducer array of claim 1, wherein the first region is within a first area having a first electrode density, and the second region is within a second area having a second electrode density, the first electrode density higher than the second electrode density.

3. The transducer array of claim 1, wherein the conductive gel layer extends outwardly from a first electrode element of the one or more electrode element.

4. The transducer array of claim 3, wherein the first region of the conductive gel layer does not overlap with the first electrode element, and the second region of the conductive gel layer overlaps with the first electrode element, and wherein the first resistance is less than the second resistance.

5. The transducer array of claim 1, wherein the one or more electrode element includes a first electrode element at least partially coextensive with the first region, and a second electrode element at least partially coextensive with the second region, the first electrode element and the second electrode element being spatially disposed within an electrode area having an outer perimeter, and wherein the first electrode element is closer to the outer perimeter than the second electrode element, and the first resistance is greater than the second resistance.

6. The transducer array of claim 1, wherein the first region has a first resistivity and the second region has a second resistivity, the first resistivity being different from the second resistivity.

7. The transducer array of claim 6, wherein the first region is within a first area having a first electrode density, and the second region is within a second area having a second electrode density different from the first electrode density.

8. The transducer array of claim 7, wherein the first electrode density is higher than the second electrode density and the first resistivity is lower than the second resistivity.

9. The transducer array of claim 1, wherein the second resistance is greater than the first resistance.

10. The transducer array of claim 1, wherein the first region of the conductive gel layer is a first material, and the second region of the conductive gel layer is a second material, the first material being different from the second material.

11. The transducer array of claim 10, wherein both the first material and the second material comprise a same component A, but one of the first material and the second material further comprises one or more component not present in the other material.

12. The transducer array of claim 1, wherein the conductive layer has a center of mass, and wherein the first region is spaced from the center of mass a first distance, and the second region is spaced from the center of mass a second distance, and wherein the second resistance is greater than the first resistance.

13. The transducer array of claim 12, wherein the resistance of the conductive gel layer varies based on distance from the center of mass.

14. The transducer array of claim 13, wherein the resistance of the conductive gel layer varies in a step-wise manner.

15. The transducer array of claim 13, wherein the resistance of the conductive gel layer varies in a continuous manner.

16. The transducer array of claim 13, wherein the resistance of the conductive gel layer increases proportionately to the distance from the center of mass.

17. The transducer array of claim 16, wherein the resistance of the conductive gel layer varies in a step-wise manner.

18. The transducer array of claim 1, wherein the one or more electrode element includes a first electrode element, and wherein the first region and the second region are at least one of electrically coupled and capacitively coupled to the first electrode element.

19. The transducer array of claim 1, further comprising:
a conductive lead electrically coupled to the electric field generator and the one or more electrode element, the conductive lead receiving the electrical signals having an alternating current waveform with a frequency between 50 kHz and 500 kHz.

20. The transducer array of claim 19, further comprising:
a blocking capacitor disposed between the electric field generator and the one or more electrode element, wherein the electrical signals pass through the blocking capacitor before being received by the electrode element.

* * * * *

UNITED STATES PATENT AND TRADEMARK OFFICE
CERTIFICATE OF CORRECTION

| | | |
|---|---|---|
| PATENT NO. | : 12,440,666 B2 | Page 1 of 1 |
| APPLICATION NO. | : 17/810062 | |
| DATED | : October 14, 2025 | |
| INVENTOR(S) | : Yoram Wasserman et al. | |

It is certified that error appears in the above-identified patent and that said Letters Patent is hereby corrected as shown below:

In the Specification

Column 26, Line 40: Delete "4200," and replace with -- 420$o$, --

Column 28, Line 42: Delete "4200," and replace with -- 420$o$, --

Column 29, Line 10: Delete "4280," and replace with -- 428$o$, --

Column 30, Line 63: Delete "4280," and replace with -- 428$o$, --

Signed and Sealed this
Thirtieth Day of December, 2025

John A. Squires
*Director of the United States Patent and Trademark Office*